United States Patent
Yu et al.

(10) Patent No.: US 10,789,127 B2
(45) Date of Patent: Sep. 29, 2020

(54) METHOD OF OPERATING MEMORY CONTROLLER FOR PERFORMING ENCODING AND DECODING BY USING A CONVOLUTION-TYPE LOW DENSITY PARITY CHECK CODE

(71) Applicant: SAMSUNG ELECTRONICS CO., LTD., Suwon-si, Gyeonggi-do (KR)

(72) Inventors: Geunyeong Yu, Seongnam-si (KR); Bohwan Jun, Uijeongbu-si (KR); Kijun Lee, Seoul (KR); Junjin Kong, Yongin-si (KR); Hong-Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 108 days.

(21) Appl. No.: 16/057,855

(22) Filed: Aug. 8, 2018

(65) Prior Publication Data

US 2019/0188078 A1 Jun. 20, 2019

(30) Foreign Application Priority Data

Dec. 18, 2017 (KR) .................. 10-2017-0174168

(51) Int. Cl.
*G06F 11/10* (2006.01)
*H03M 13/11* (2006.01)
*H03M 13/00* (2006.01)
*H03M 13/39* (2006.01)

(52) U.S. Cl.
CPC ..... *G06F 11/1076* (2013.01); *H03M 13/1105* (2013.01); *H03M 13/1154* (2013.01); *H03M 13/3972* (2013.01); *H03M 13/616* (2013.01)

(58) Field of Classification Search
CPC ......... H03M 13/3972; H03M 13/1105; H03M 13/616; H03M 13/1154; G06F 11/1076
See application file for complete search history.

(56) References Cited

U.S. PATENT DOCUMENTS

| | | | |
|---|---|---|---|
| 8,230,296 B2 | 7/2012 | Belogolovy et al. | |
| 9,106,264 B2 | 8/2015 | Alhussien et al. | |
| 2004/0123229 A1 | 6/2004 | Kim et al. | |
| 2011/0087933 A1* | 4/2011 | Varnica | H03M 13/112 714/704 |
| 2012/0198308 A1 | 8/2012 | Varnica et al. | |
| 2013/0139022 A1* | 5/2013 | Chen | H03M 13/1117 714/752 |
| 2013/0145238 A1 | 6/2013 | Alhussien et al. | |

(Continued)

*Primary Examiner* — Guy J Lamarre
(74) *Attorney, Agent, or Firm* — Volentine, Whitt & Francos, PLLC

(57) ABSTRACT

A method of operating a memory controller that performs decoding by using a parity check matrix corresponding to a convolution-type low density parity check (LDPC) code includes receiving a codeword from at least one memory device, the codeword including a first sub-codeword and a second sub-codeword; decoding a first sub-codeword into first data by using first sliding windows in a first direction, set based on a first sub-matrix included in the parity check matrix and associated with the first sub-codeword; and decoding a second sub-codeword into second data by using second sliding windows in a second direction, set based on a second sub-matrix included in the parity check matrix and associated with the second sub-codeword.

14 Claims, 30 Drawing Sheets

(56) References Cited

U.S. PATENT DOCUMENTS

| | | | |
|---|---|---|---|
| 2013/0232389 A1* | 9/2013 | Varnica | H03M 13/112 |
| | | | 714/752 |
| 2014/0223256 A1 | 8/2014 | Sakai et al. | |
| 2015/0372697 A1 | 12/2015 | Alhussien et al. | |
| 2016/0164538 A1 | 6/2016 | Abu-Surra et al. | |
| 2016/0336964 A1* | 11/2016 | Khalil | H03M 13/114 |
| 2017/0257117 A1* | 9/2017 | Goldenberg | G06F 11/1012 |
| 2018/0219561 A1* | 8/2018 | Litsyn | H03M 13/2915 |

* cited by examiner

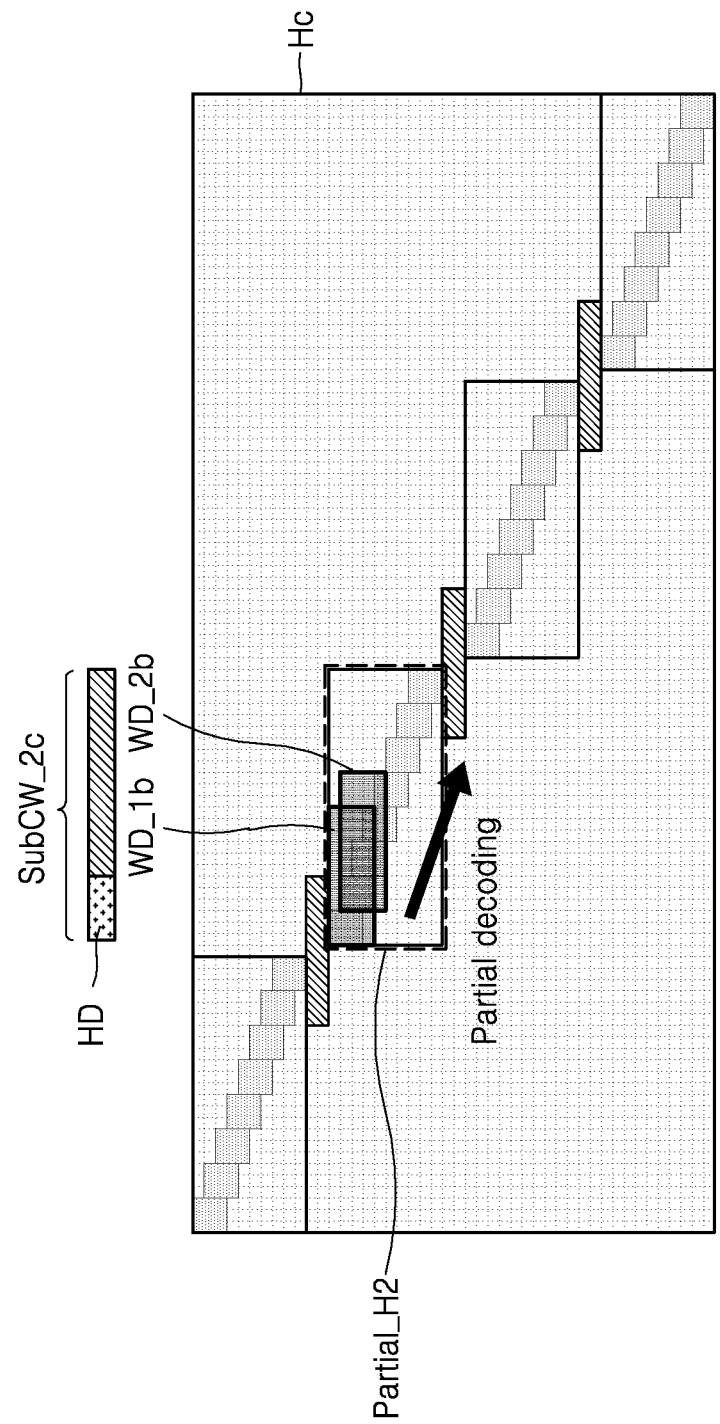

METHOD OF OPERATING MEMORY CONTROLLER FOR PERFORMING ENCODING AND DECODING BY USING A CONVOLUTION-TYPE LOW DENSITY PARITY CHECK CODE

CROSS-REFERENCE TO RELATED APPLICATION

This application claims the benefit of Korean Patent Application No. 10-2017-0174168, filed on Dec. 18, 2017, in the Korean Intellectual Property Office, the disclosure of which is incorporated herein in its entirety by reference.

BACKGROUND

The inventive concept relates to a memory controller, and more particularly, to a memory controller for performing an encoding operation and a decoding operation on data for a memory operation, a memory system including the memory controller, and a method of operating the memory controller.

When performing decoding on a codeword based on a convolution-type low density parity check (LDPC) code, for example a spatially coupled LDPC code, it is possible to perform sliding window decoding with only a part of the entire codeword. With this decoding scheme, the data output latency of a memory system which is at a level equivalent to that of decoding based on the existing block LDPC code may be secured, and the memory system may have improved correction capability. However, when a memory system performs encoding and decoding based on a convolution-type LDPC code having a long length, the memory system has to decode the entire codeword and then output only a desired portion of a decoding result to a host as read data, due to the size unit of the read data that is received by the host from the memory system. Such a problem limits the improvement of the data output latency of the memory system.

SUMMARY

The inventive concept provides a memory controller capable of performing a decoding operation for improving the output latency of a memory system.

The inventive concept provides a memory system including the memory controller.

The inventive concept also provides a method of operating the memory controller.

According to an aspect of the inventive concept, there is provided a method of operating a memory controller configured to perform decoding by using a parity check matrix corresponding to a convolution-type low density parity check (LDPC) code. The method includes: receiving a codeword from at least one memory device, the codeword including a first sub-codeword and a second sub-codeword; decoding the first sub-codeword into first data by using first sliding windows in a first direction, set based on a first sub-matrix included in the parity check matrix and associated with the first sub-codeword; and decoding the second sub-codeword into second data by using second sliding windows in a second direction, set based on a second sub-matrix included in the parity check matrix and associated with the second sub-codeword.

According to another aspect of the inventive concept, there is provided a method of operating a memory system that performs encoding and decoding by using a parity check matrix corresponding to a convolution-type low density parity check (LDPC) code and includes a memory controller and at least one memory device. The method includes: receiving, by the memory controller, from a host, a write request and write data to be stored in the memory system; encoding, by the memory controller, first data of the write data into a first sub-codeword based on a first sub-matrix included in the parity check matrix; encoding, by the memory controller, second data of the write data into a second sub-codeword based on a second sub-matrix included in the parity check matrix; and writing, by the memory controller, a codeword in the at least one memory device, the codeword including the first sub-codeword and the second sub-codeword.

According to another aspect of the inventive concept, there is provided a method of operating a memory controller that performs decoding by using a parity check matrix corresponding to a convolution-type low density parity check (LDPC) code, wherein the parity check matrix includes a first partial parity check matrix, a second partial parity check matrix, and tunneling information associated with the first partial parity check matrix and the second partial parity check matrix. The method includes: receiving from a memory device a codeword including a first sub-codeword; performing a first phase decoding operation on the first sub-codeword by using first sliding windows set based on the first partial parity check matrix associated with the first sub-codeword; and performing a second phase decoding operation on the first sub-codeword by using the tunneling information based on a result of the first phase decoding operation.

According to yet another aspect of the inventive concept, there is provided a method of operating a memory system. The method comprises: a memory controller of the memory system receiving from a host a write request and write data to be stored in the memory system; the memory controller performing a convolution-type low density parity check (LDPC) encoding of the write data using a parity check matrix to produce a codeword corresponding to the write data, and the memory controller writing the codeword into one or more memory devices of the memory system. The LDPC encoding comprises: the memory controller encoding first data of the write data into a first sub-codeword based on a first sub-matrix included in the parity check matrix, and the memory controller encoding second data of the write data into a second sub-codeword based on a second sub-matrix included in the parity check matrix, wherein the codeword comprises the first sub-codeword and the second sub-codeword.

BRIEF DESCRIPTION OF THE DRAWINGS

Embodiments of the inventive concept will be more clearly understood from the following detailed description taken in conjunction with the accompanying drawings.

FIGS. 18, 19A, 19B, 19C, 20A, 20B and 21 are diagrams for explaining various embodiments of a second phase decoding operation of FIG. 17.

DETAILED DESCRIPTION OF THE EMBODIMENTS

Figure 1:
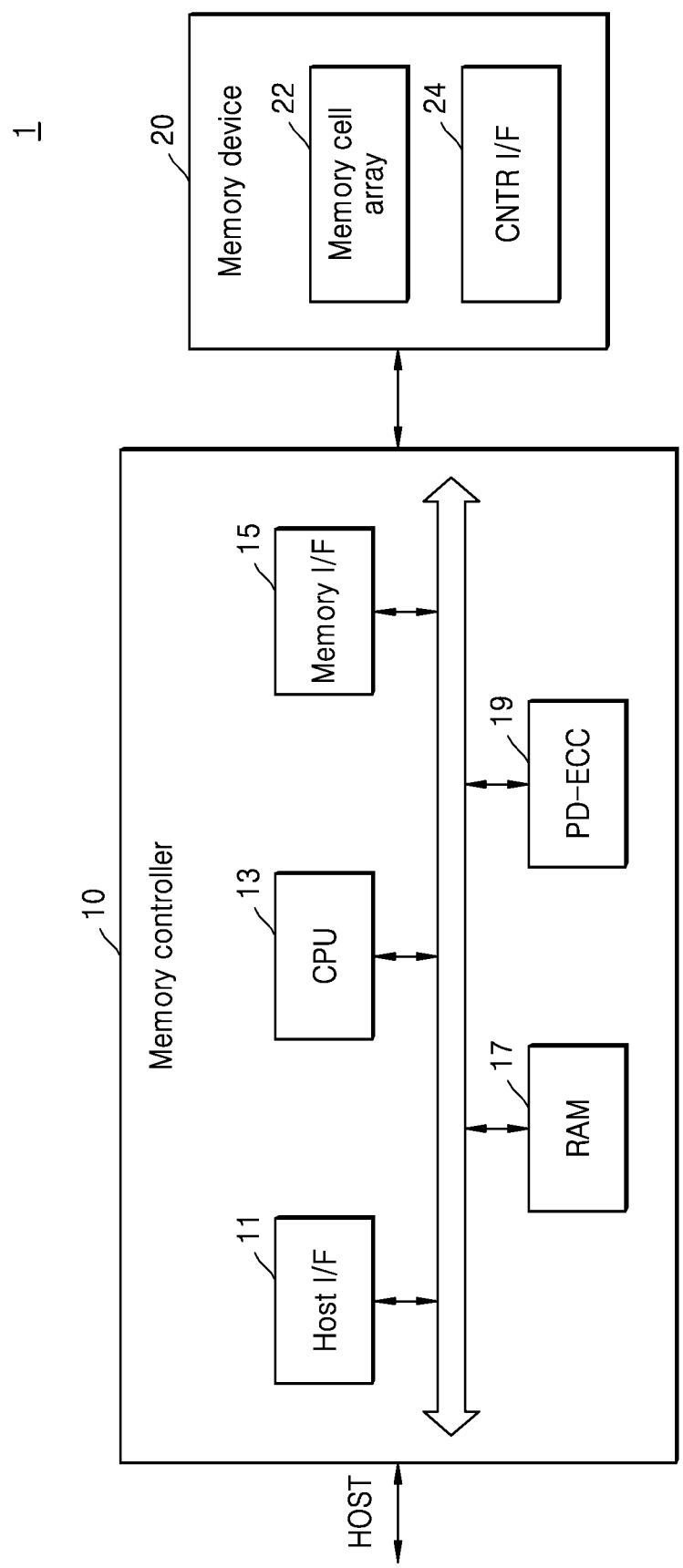
FIG. 1 is a schematic block diagram of an embodiment of a memory system.

Hereinafter, embodiments of the inventive concept will be described in detail with reference to the accompanying drawings. Like reference numerals denote like elements in the drawings, and redundant description thereof will be omitted.

FIG. 1 is a block diagram of an embodiment of a memory system 1.

Referring to FIG. 1, memory system 1 may include a memory controller 10 and one or more memory devices 20. Memory system 1 shown in FIG. 1 may correspond to any one of various data storage media based on a non-volatile memory, for example, a memory card, a universal serial bus (USB) memory, and a solid state drive (SSD). Memory device 20 may include a memory cell array 22 and an interface 24 for transmitting and receiving data and the like to and from memory controller 10. Memory cell array 22 may have a two-dimensional structure (or a horizontal structure) formed in a direction parallel to a substrate, or a three-dimensional structure (or a vertical structure) formed in a direction perpendicular to the substrate. Memory cells in memory cell array 22 may be non-volatile memory cells. For example, memory cell array 22 may be a NAND flash memory cell array or a NOR flash memory cell array. Hereinafter, embodiments will be described in detail with reference to a case where the memory cells in memory cell array 22 are flash memory cells. However, embodiments are not limited thereto, and in other embodiments, the memory cells in memory cell array 22 may be resistive memory cells such as resistive random access memory (RRAM) cells, phase change RAM (PRAM) cells, or magnetic RAM (MRAM) cells.

Memory controller 10 may control memory operations such as write (or program), read, and erase operations on memory device 20 in response to a request (e.g., a write request, a read request, an erase request, etc.) received from a host HOST. Memory controller 10 may include a host interface 11, a central processing unit (or processor) 13, a memory interface 15, RAM 17, and a partially decodable error checking and correcting (ECC) logic element 19. In various embodiments, partially decodable ECC logic element 19 may comprise a logic circuit and/or a processor configured to perform logic operations in response to instructions stored in a memory, etc. Hereinafter, partially decodable ECC logic element 19 is referred to as "ECC logic 19" for convenience of description.

Memory controller 10 may transmit and receive data and the like to and from the host HOST through host interface 11 and may transmit and receive data and the like to memory device 20 through memory interface 15. For example, memory controller 10 may receive from the host HOST a write request and write data to be stored in memory system 1 by writing the data to one or more memory devices 20. Also, memory controller 10 may receive from the host HOST a read request and an address or addresses to read data from memory devices 20 of memory system 1. Host interface 11 may be connected to the host HOST via a parallel AT attachment (PATA) bus, a serial AT attachment (SATA) bus, a small computer system interface (SCSI), a USB, a PCIe, or the like. Central processing unit 13 may control overall operations (e.g., write, read, file system management) for memory device 20. RAM 17 may operate under the control of central processing unit 13 and may be used as a work memory, a buffer memory, a cache memory, or the like. When RAM 17 is used as a working memory, data processed by central processing unit 13 may be temporarily stored in RAM 17. When RAM 17 is used as a buffer memory, RAM 17 may be used to buffer write data to be transferred from the host HOST to memory device 20, or read data to be transferred from memory device 20 to the host HOST. Furthermore, when ECC logic 19 encodes write data received from the host HOST, or decodes a codeword received from memory device 20, RAM 17 may be used as a buffer for encoding and decoding operations.

ECC logic 19 may receive a codeword from memory device 20 and perform error correction decoding on the codeword. That is, because the codeword received from memory device 20 may have a bit error due to deterioration of memory cells of memory cell array 22, noise related to a memory operation, or the like, ECC logic 19 may correct errors for the codeword and provide read data with integrity to the host HOST. ECC logic 19 may perform decoding on a codeword, based on a convolution-type low density parity check (LDPC) code, e.g., a spatially coupled LDPC code. The LDPC code may be a kind of linear block code that enables iterative decoding, and the LDPC code may be implemented with one parity check matrix. Hereinafter, the operation of ECC logic 19 will be described focusing on the parity check matrix corresponding to the LDPC code, and it is assumed that the codeword is a set of data having a size unit that may be encoded and generated or decoded through one parity check matrix corresponding to the LDPC code. The codeword may include sub-codewords, and the size unit of each of the sub-codewords may be less than or equal to a data size unit which memory controller 10 sends to the host HOST in response to a read request.

In an embodiment, ECC logic 19 may perform decoding on a sub-codeword basis. Performing decoding on a sub-codeword basis may be defined as a partial decoding operation. Specifically, ECC logic 19 may perform decoding on a sub-codeword basis, based on a sub-matrix or partial parity check matrix, according to the structure of the parity check matrix. Thus, since ECC logic 19 may perform decoding on a sub-codeword basis by using only a part of the parity check matrix, the time required to provide read data requested from the host HOST may be reduced. As a result, the data output latency of memory system 1 may be improved.

In an embodiment, ECC logic 19 may perform encoding of write data on a sub-codeword basis to enable decoding on a sub-codeword basis. Specifically, ECC logic 19 may perform encoding on a sub-codeword basis, based on a sub-matrix or partial parity check matrix, in accordance with the structure of the parity check matrix.

Memory controller 10 may rearrange a codeword generated as a result of an encoding operation of ECC logic 19 and provide the rearranged codeword to memory device 20, so that later quick decoding may be performed. Memory device 20 may store the rearranged codeword directly in memory cell array 22 and provide the rearranged codeword to memory controller 10 in response to a read command from memory controller 10. In an embodiment, memory controller 10 may rearrange write data in advance before the encoding operation of ECC logic 19 so that later quick decoding may be performed. In addition, memory device 20 may rearrange a stored codeword before outputting the stored codeword in response to a read command from memory controller 10 and output the rearranged codeword to memory controller 10, so that later quick decoding may be performed. As described above, memory controller 10 or memory device 20 may efficiently perform a decoding operation by rearranging a codeword considering a later quick decoding operation, and may also perform a simple partial decoding operation.

Figure 2:
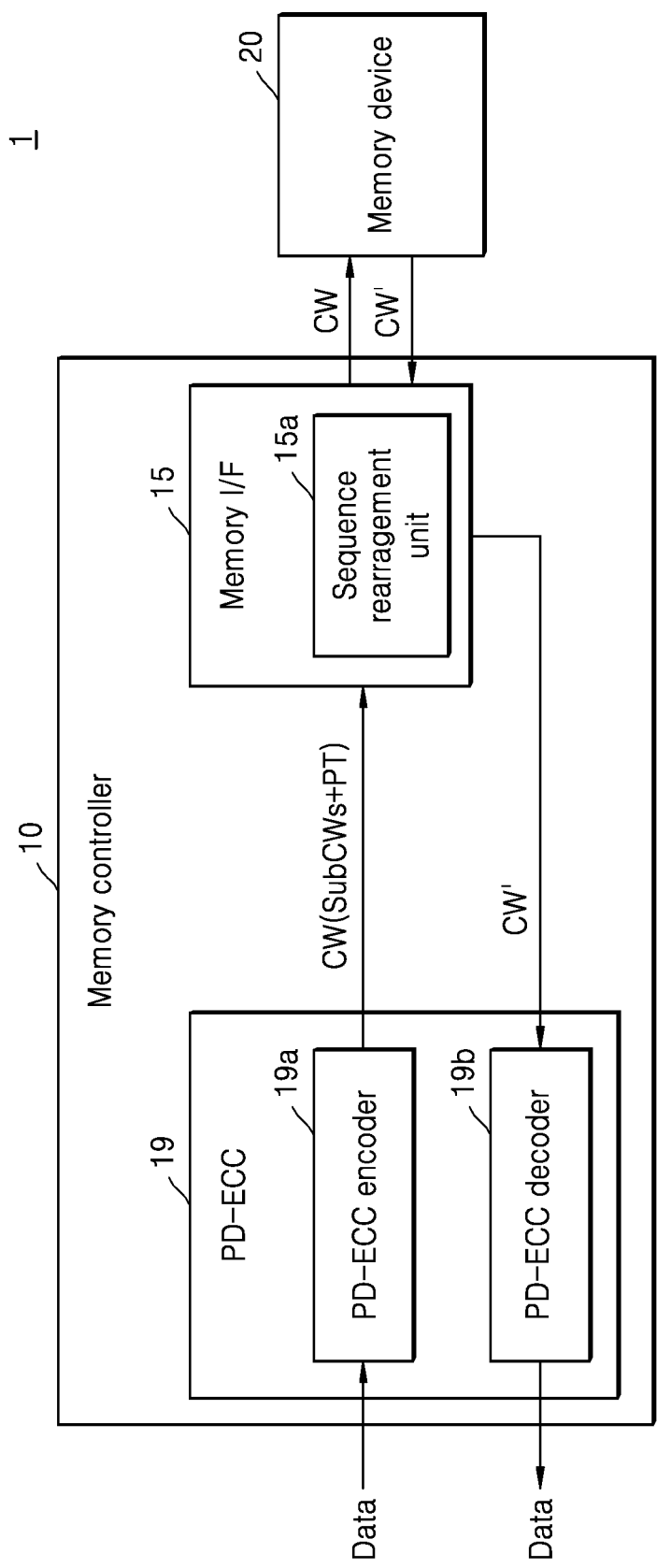
FIG. 2 is a block diagram for explaining the operation of an embodiment of an error checking and correcting (ECC) logic.

FIG. 2 is a block diagram for explaining an embodiment of the operation of ECC logic 19. Hereinafter, only a part of the configuration of memory system 1 is shown to explain the operation of ECC logic 19, and a detailed configuration of memory system 1 is shown in FIG. 1.

Referring to FIG. 2, ECC logic 19 may include an ECC encoder 19a and an ECC decoder 19b. ECC encoder 19a may generate an error correction code (ECC) for correcting a bit error. ECC encoder 19a may encode write data Data received from a host to thereby generate a codeword CW. The codeword CW may include at least two sub-codewords SubCWs and a termination parity PT. The termination parity PT may be bit data to ensure that a syndrome of the codeword CW becomes a zero vector. The details of the termination parity PT will be described below with reference to FIG. 3. Each of the sub-codewords SubCWs may include information bits corresponding to the write data Data and parity for error correction. Hereinafter, it is assumed that the parity may include a plurality of parity bits and the termination parity PT may include a plurality of termination parity bits. For example, ECC encoder 19a may divide a parity check matrix into a first sub-matrix and a second sub-matrix, encode some of the write data Data based on the first sub-matrix to thereby generate a first sub-codeword, and encode the remainder of the write data Data based on the second sub-matrix to thereby generate a second sub-codeword.

Memory interface 15 may receive the codeword CW from ECC encoder 19a and output the received codeword CW to memory device 20. In this case, memory interface 15 may include a sequence rearrangement unit 15a, and sequence rearrangement unit 15a may rearrange the order between the sub-codewords SubCWs and the termination parity PT of the codeword CW, or rearrange the order of bits included in one sub-codeword SubCW. Memory device 20 may receive the codeword CW and store the received codeword CW in memory cell array 22 and then may output a codeword CW' stored in memory device 20 to memory controller 10 in response to a read command of memory controller 10. As described above, the codeword CW' may include bit errors due to deterioration of memory cells of memory device 20 or the like. Memory interface 15 may provide ECC decoder 19b with the codeword CW' received from memory device 20. Although FIG. 2 shows a case in which the codeword CW' is directly provided from memory interface 15 to ECC decoder 19b, embodiments are not limited thereto. For example, memory controller 10 may further include a predetermined buffer (for example, RAM 17 in FIG. 1), and the buffer may temporarily store the codeword CW'. ECC decoder 19b may selectively read (or receive) a part of a codeword from the buffer to thereby perform a decoding operation on a sub-codeword basis. ECC decoder 19b performs a decoding operation on a sub-codeword basis, and when the decoding of data Data corresponding to a data size unit output from memory controller 10 to the host is completed, memory controller 10 may directly output decoded data to the host.

Figure 3:
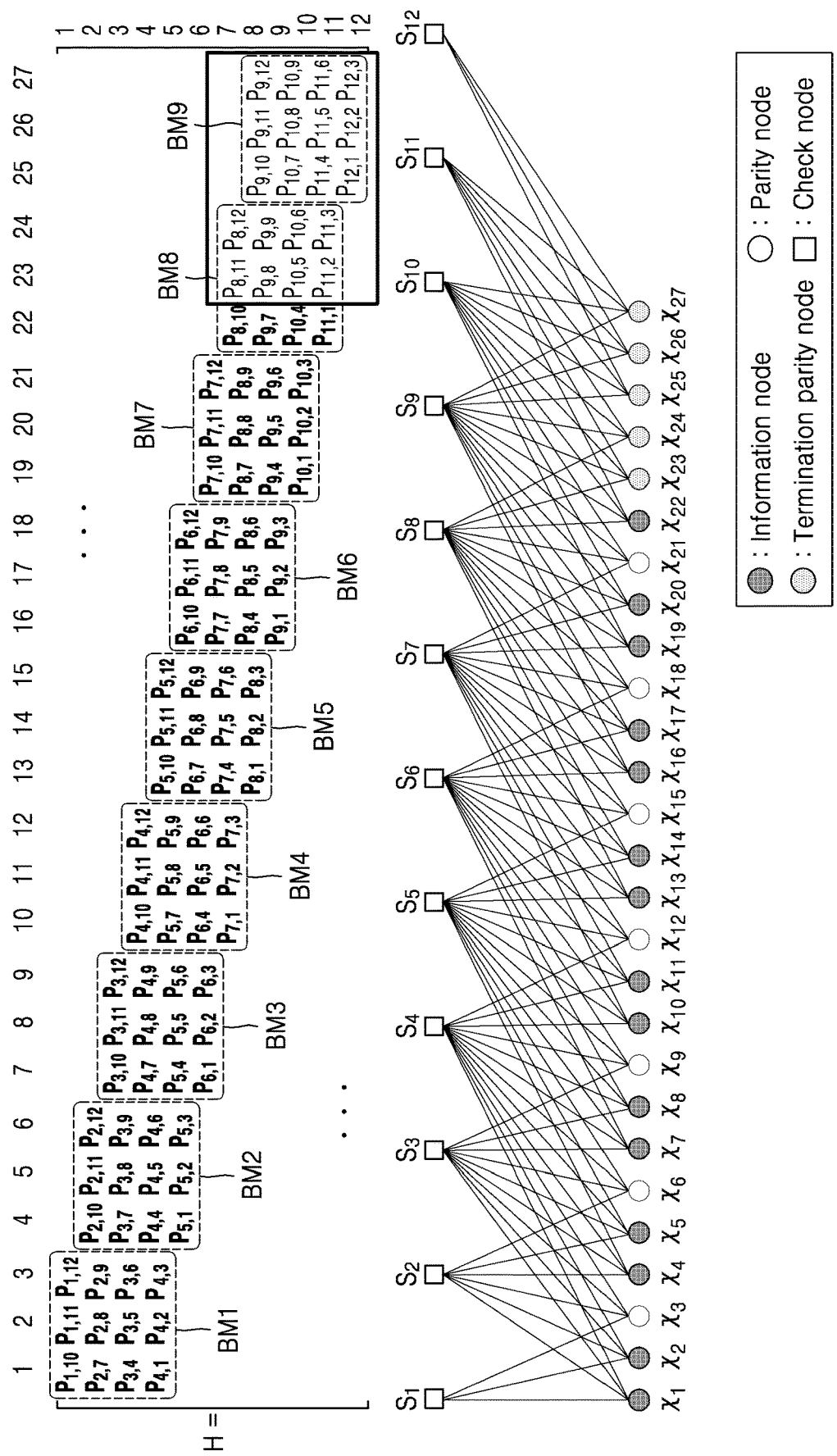
FIG. 3 is a diagram for explaining an embodiment of a parity check matrix corresponding to a low density parity check (LDPC) code.

FIG. 3 is a diagram for explaining an embodiment of a parity check matrix H corresponding to an LDPC code.

Referring to FIG. 3, a tanner graph may include 12 check nodes $S_1$ to $S_{12}$ and 27 variable nodes, i.e., 15 information nodes $X_1$, $X_2$, $X_4$, $X_5$, $X_7$, $X_8$, $X_{10}$, $X_{11}$, $X_{13}$, $X_{14}$, $X_{16}$, $X_{17}$, $X_{19}$, $X_{20}$, and $X_{22}$, 7 parity nodes $X_3$, $X_6$, $X_9$, $X_{12}$, $X_{15}$, $X_{18}$, and $X_{21}$, and 5 termination parity nodes $X_{23}$, $X_{24}$, $X_{25}$, $X_{26}$, and $X_{27}$. The i-th column (where i is an integer) and the j-th row (where j is an integer) of the parity check matrix H may correspond to a variable node $X_i$ and a check node $S_j$, respectively. A parity check equation may be represented by variable nodes connected to one check node. For example, two information nodes $X_1$ and $X_2$ and the parity node $X_3$ may be connected to the check node $S_1$, and in this way, one parity check equation may be derived. The parity check equation is a formula that constitutes $H \cdot CW^T = 0$ (where CW is a matrix corresponding to a codeword), and thus, the parity check equation may be determined by the parity check matrix H.

Since the parity check matrix H includes 27 columns, the length of a codeword generated based on the parity check matrix H may be composed of 27 bits. The codeword may include parity and termination parity for checking and correcting information bits corresponding to data received from a host and a bit error. In particular, the termination parity is used to guarantee the reception quality of a codeword of a memory device, and may be generated based on the parity check matrix H by using a virtual information bit having a value which a memory controller and a memory device have determined in advance. In other words, the termination parity may be bit data to ensure that a syndrome of the entire codeword becomes a zero vector. The syndrome of the entire codeword may be a result of the operation of $H \cdot CW^T$. As an example, the termination parity may be generated based on a part or the entirety of each of eighth and ninth base matrices BM8 and BM9. However, the parity check matrix H shown in FIG. 3 is only an example, is not limited thereto, and may be variously designed. In addition, the termination parity may be present in one sub-block LPDC code or be present over a plurality of sub-block LPDC codes, according to a code rate of a codeword and a degree value of a variable node.

Figure 4:
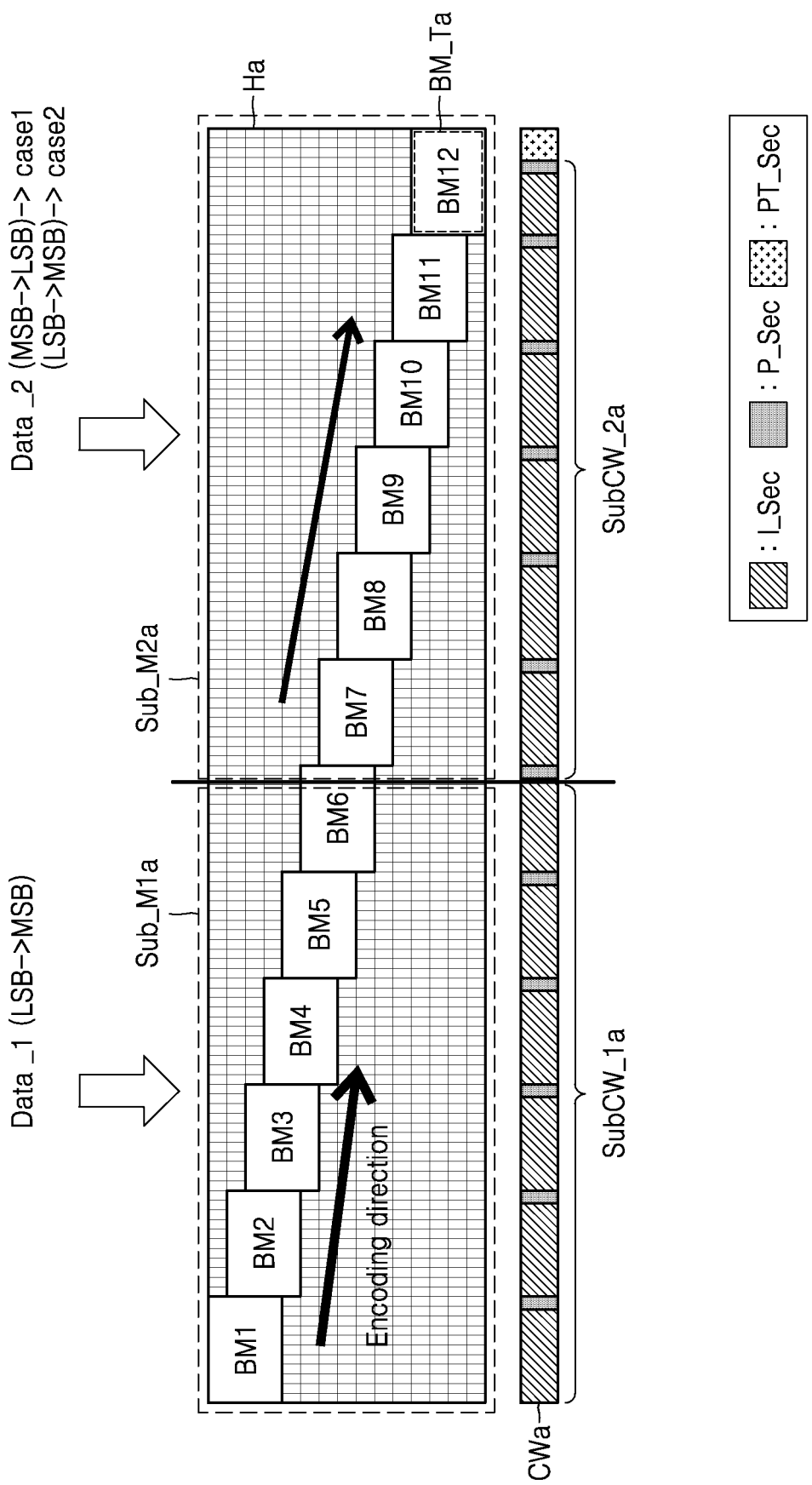
FIG. 4 is a diagram for explaining the operation of an ECC encoder of FIG. 2, which conforms to the structure of a parity check matrix.

FIG. 4 is a diagram for explaining the operation of ECC encoder 19a of FIG. 2, which conforms to the structure of a parity check matrix Ha.

Referring to FIGS. 2 and 4, the parity check matrix Ha may include first and second sub-matrices Sub_M1a and Sub_M2a, and a termination matrix BM_Ta for generating termination parity may be positioned at a last part in the second sub-matrix Sub_M2a. That is, a twelfth base matrix BM12 may correspond to a termination matrix BM_Ta. ECC encoder 19a may encode first data Data_1 of the write data Data received from the host, based on the first sub-matrix Sub_M1a, to thereby generate a first sub-codeword SubCW_1a, and may encode second data Data_2 of the write data Data, based on the second sub-matrix Sub_M2a, to thereby generate a second sub-codeword SubCW_2a. Each of the first and second sub-codewords SubCW_1a and SubCW_2a may include an information sector I_Sec in which information bits are arranged, and a parity sector P_Sec in which parity is arranged. ECC encoder 19a may generate the termination parity by using the twelfth base matrix BM12 in encoding the second data Data_2. A codeword CWa may include a first sub-codeword, a second sub-codeword, and termination parity. The termination parity may be positioned in a termination parity sector PT_sec at the rear end of the second sub-codeword SubCW_2a. Memory controller 10 may output an encoded codeword CWa as described above to memory device 20.

In an embodiment, memory controller 10 may rearrange data in advance before encoding, taking into account decoding to be described with reference to FIG. 6A and the like later. As an example, in a first case case1, memory controller 10 may not rearrange the first data Data_1 and may reverse the second data Data_2 so that the second data Data_2 is encoded in a direction from the most significant bit (MSB) of the second data Data_2 to the least significant bit (LSB) of the second data Data_2. However, as in a second case case2, memory controller 10 may not control a rearrangement operation for the first data Data_1 and the second data Data_2.

Figure 5:
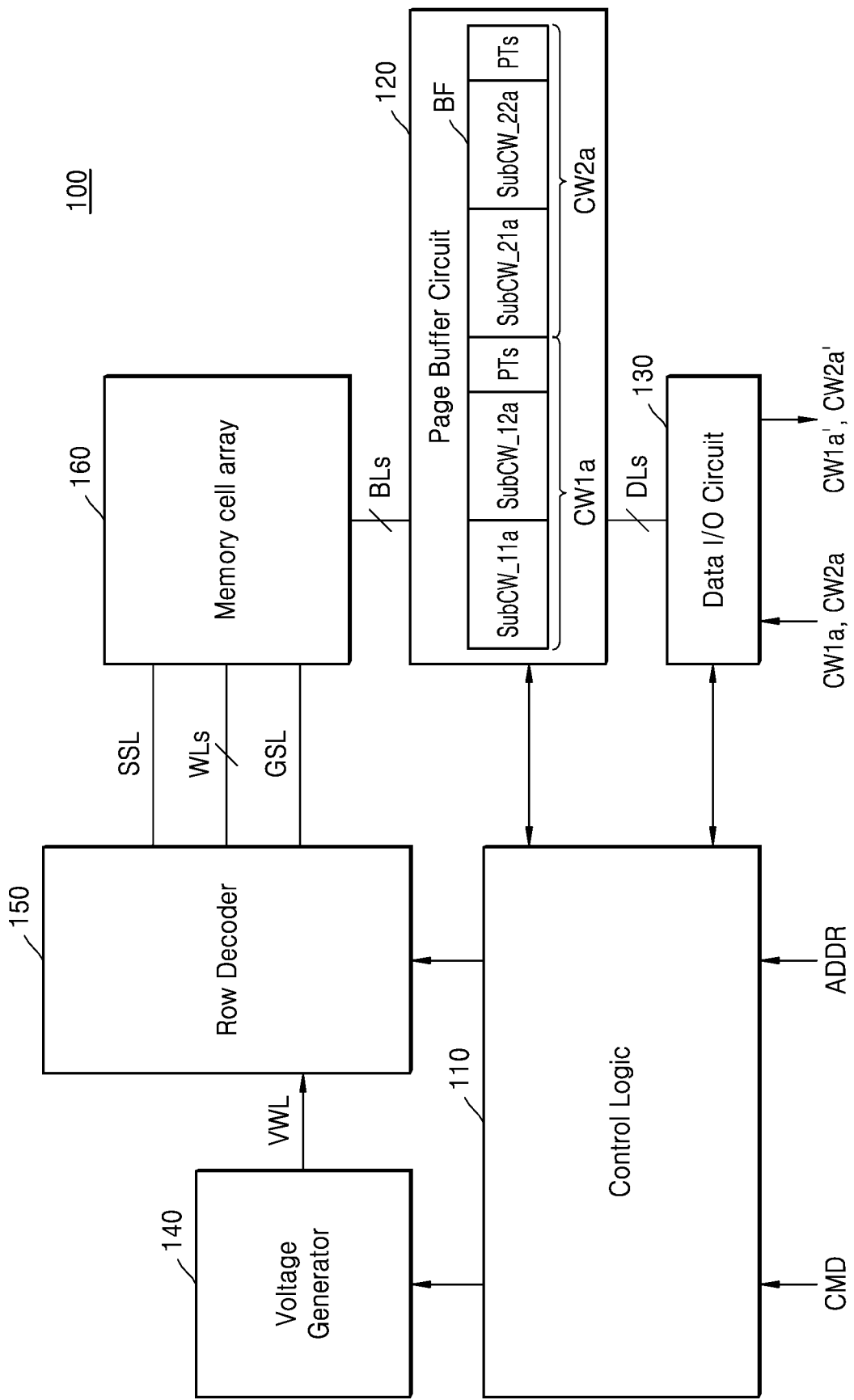
FIG. 5 is a diagram for explaining a memory operation of an embodiment of a memory device.

FIG. 5 is a diagram for explaining a memory operation of an embodiment of a memory device 100.

Referring to FIG. 5, memory device 100 may include a control logic element 110, a page buffer circuit 120, a data input/output (I/O) circuit 130, a voltage generator 140, a row decoder 150, and a memory cell array 160. In various embodiments, control logic element 110 may comprise a logic circuit and/or a processor configured to perform logic operations in response to instructions stored in a memory, etc. Hereinafter, control logic element 110 is referred to as "control logic 110" for convenience of description. Data I/O circuit 130 may correspond to interface 24 of memory device 20 of FIG. 1.

Memory cell array 160 may be connected to row decoder 150 via word lines WLs, a string select line SSL, and ground select lines GSL and may be coupled to page buffer circuit 120 via bit lines BLs. Memory cell array 160 may include a plurality of memory blocks.

Row decoder 150 may decode an address to thereby select any one of the word lines WLs of memory cell array 160. Row decoder 150 may provide a word line voltage VWL, received from voltage generator 140, to a selected word line WL of memory cell array 160. Page buffer circuit 120 may operate as a write driver or a sense amplifier in accordance with operations performed by control logic 110.

Control logic 110 may control a memory operation based on a command CMD and an address ADDR received from a memory controller. Data I/O circuit 130 may receive first and second codewords CW1a and CW2a. Data I/O circuit 130 may sequentially provide the received first and second codewords CW1a and CW2a to page buffer circuit 120. For example, data I/O circuit 130 may provide bits of each of the received first and second codewords CW1a and CW2a in the order from LSB to MSB to page buffer circuit 120. Page buffer circuit 120 may include a page buffer BF having a preset size and the first and second codewords CW1a and CW2a may be temporarily written to the page buffer BF. The size of the page buffer BF may correspond to a minimum size unit of data written to memory cell array 160 or read from memory cell array 160. For example, the first codeword CW1a may be stored in the page buffer BF in the order of a first sub-codeword SubCW_11a, a second sub-codeword SubCW_12a, and a termination parity PT, and the second codeword CW2a may be stored in the page buffer BF in the order of a first sub-codeword SubCW_21a, a second sub-codeword SubCW_22a, and a termination parity PT. Page buffer circuit 120 may write the first and second codewords CW1a and CW2a stored in the page buffer BF into memory cell array 160 as one unit (e.g., a page unit) under the control of control logic 110.

Control logic 110 may receive a read command CMD and an address ADDR from the memory controller. Page buffer circuit 120 may read codewords CW1a' and CW2a', stored in memory cell array 160, under the control of control logic 110 and temporarily write the codewords CW1a' and CW2a' into the page buffer BF. Page buffer circuit 120 may output the codewords CW1a' and CW2a' stored in the page buffer BF to the memory controller through data I/O circuit 130 under the control of control logic 110.

Although FIG. 5 illustrates a page buffer BF having a size corresponding to the data size of two codewords, embodiments are not limited thereto. For example, the page buffer BF may be implemented to have various sizes according to a memory operation specification.

Figure 6A:
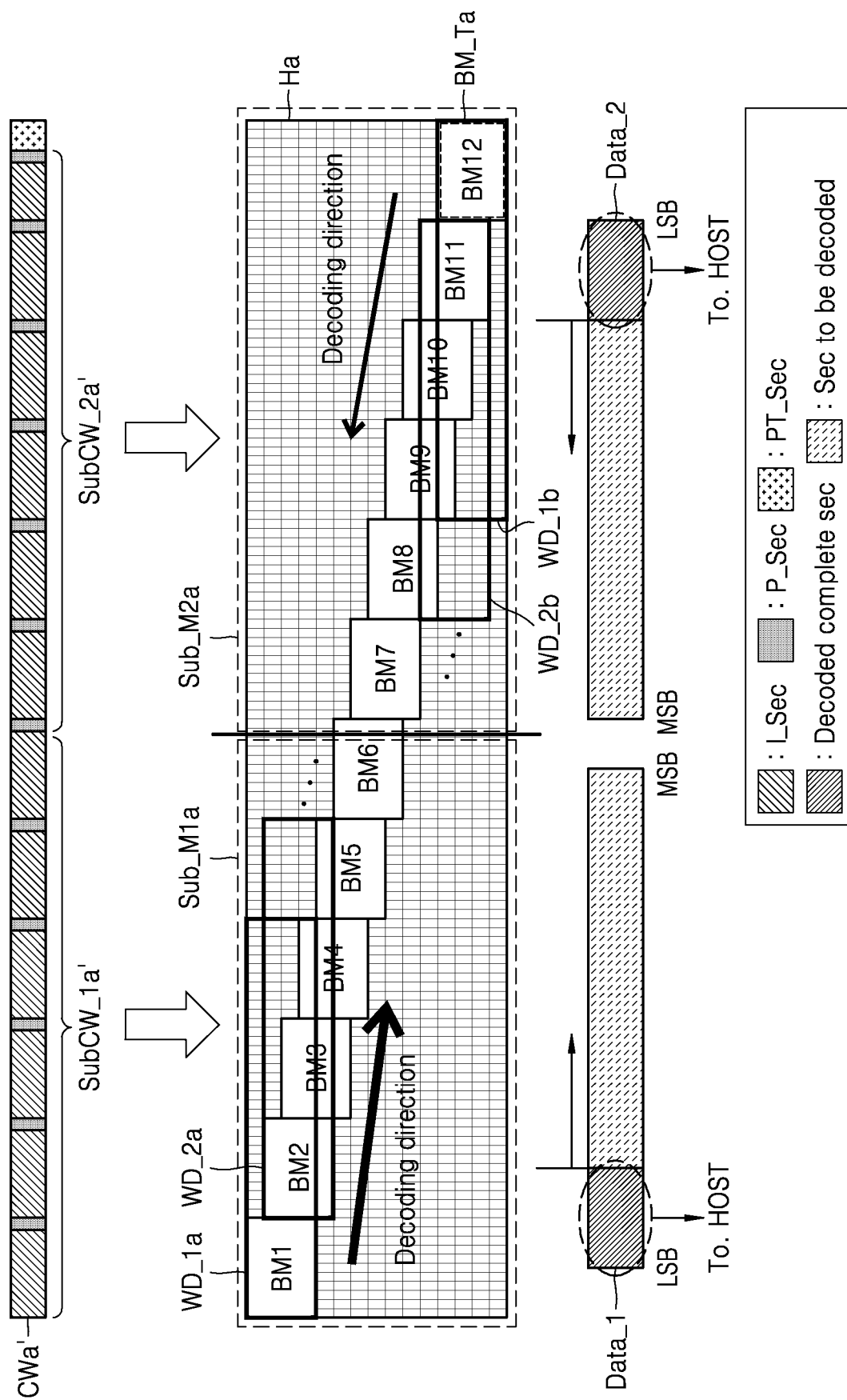
FIGS. 6A and 6B are diagrams for explaining the operation of the ECC decoder of FIG. 2, which conforms to the structure of a parity check matrix.
Figure 6B:
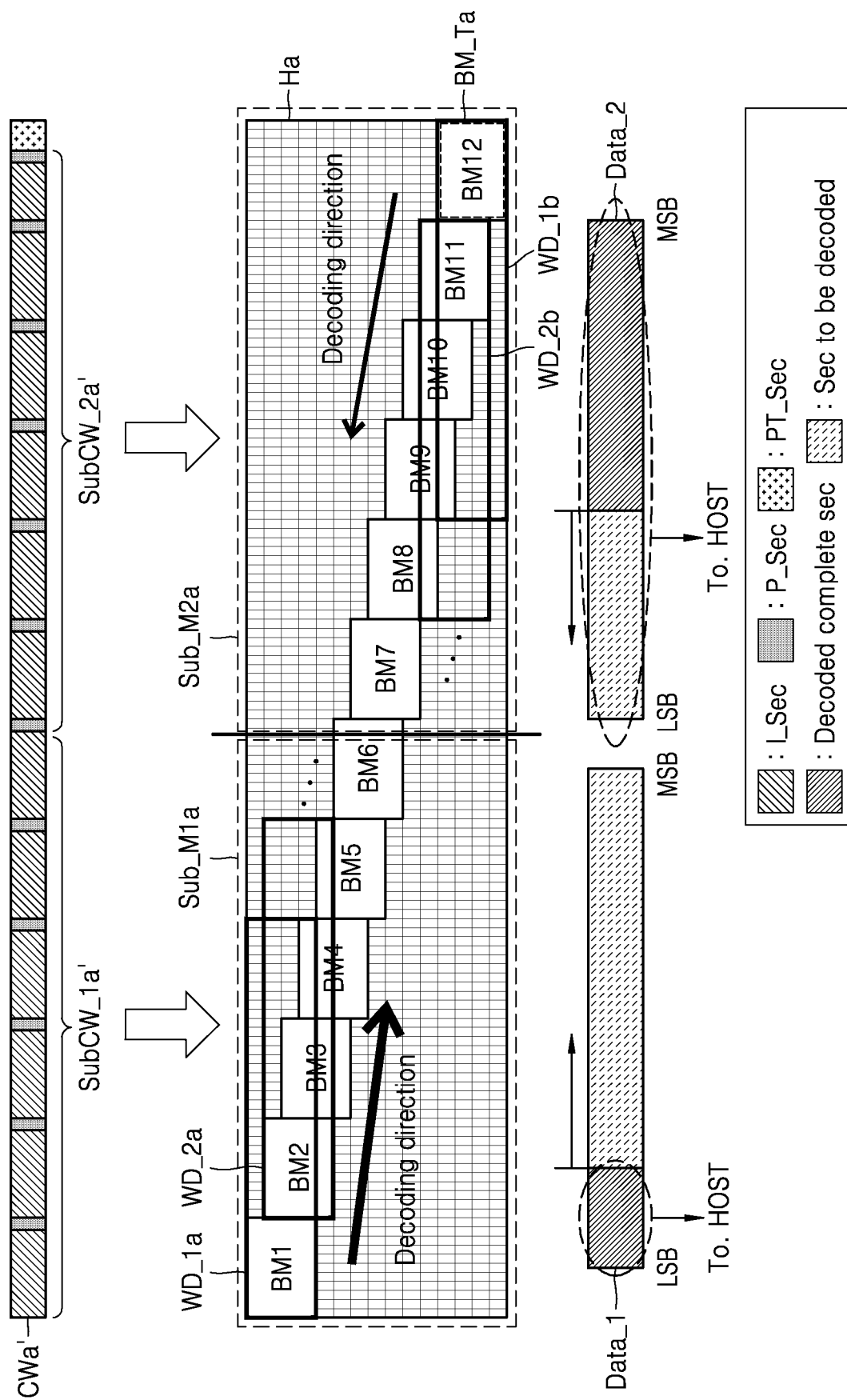

FIGS. 6A and 6B are diagrams for explaining the operation of ECC decoder 19b of FIG. 2, which conforms to the structure of a parity check matrix Ha. FIG. 6A is a diagram illustrating a case where decoding is performed assuming the first case case1 of FIG. 4, and FIG. 6B is a diagram illustrating a case where decoding is performed assuming the second case case2 of FIG. 4.

Referring to FIGS. 2 and 6A, ECC decoder 19b may decode a first sub-codeword SubCW_1a' into first data Data_1 by using first sliding windows WD_1a, WD_2a, . . . in a first direction, set based on a first sub-matrix Sub_M1a associated with the first sub-codeword SubCW_1a'. ECC decoder 19b may decode the first sub-codeword SubCW_1a' by using a parity check equation derived from row and column components contained in each of the first sliding windows WD_1a, WD_2a, . . . in the first direction. Specifically, ECC decoder 19b may decode the first sub-codeword SubCW_1a' while moving the first sliding windows WD_1a, WD_2a, . . . in a diagonal direction toward the lower right with respect to the parity check matrix Ha, and accordingly, the first sub-codeword SubCW_1a' may be decoded in a direction from the LSB of the first sub-codeword SubCW_1a' to the MSB thereof. As a result, as the decoding is performed, the LSB of the first data Data_1 may be generated first and the MSB of the first data Data_1 may be finally generated. Bits of the first data Data_1 corresponding to a sector in which decoding is completed may be preferentially output to the host HOST as read data.

ECC decoder 19b may decode a second sub-codeword SubCW_2a' into second data Data_2 by using second sliding windows WD_1b, WD_2b, . . . in a second direction, which may be opposite to the first direction, set based on a second sub-matrix Sub_M2a associated with the second sub-codeword SubCW_2a'. Specifically, ECC decoder 19b may decode the second sub-codeword SubCW_2a' while moving the second sliding windows WD_1b, WD_2b, . . . in a diagonal direction toward the upper left with respect to the parity check matrix Ha, and accordingly, the second sub-codeword SubCW_2a' may be decoded in a direction from the MSB of the second sub-codeword SubCW_2a' to the LSB thereof. As described above, in the first case case1 of FIG. 4, the second data Data_2 is reversed before being encoded, and thus, as the decoding is performed, the LSB of the second data Data_2 may be generated first and the MSB of the second data Data_2 may be finally generated. Bits of the second data Data_2 corresponding to a sector in which decoding is completed may be preferentially output to the host HOST.

Referring to FIG. 6B, unlike FIG. 6A, in the second case case2 of FIG. 4, a rearrangement operation is not performed before encoding the second data Data_2, and thus, as the decoding is performed, the MSB of the second data Data_2 may be generated first and the LSB of the second data Data_2 may be finally generated. Accordingly, when the decoding of the second sub-codeword SubCW_2a' is completed and the entire second data Data_2 is generated, Bits from the LSB to the MSB of the second data Data_2 may be sequentially output to the host HOST.

Figure 7A:
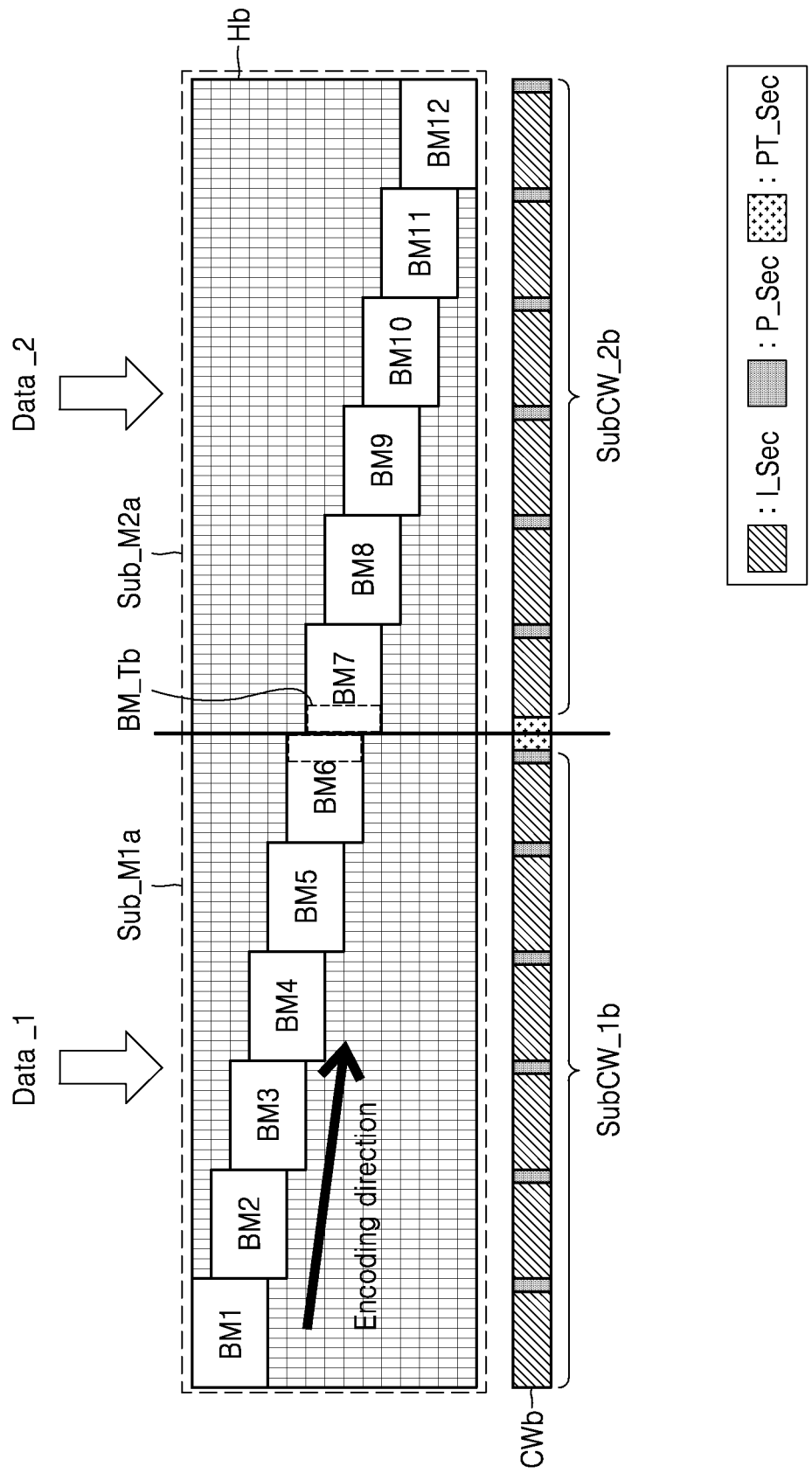
FIG. 7A is a diagram for explaining the operation of the ECC encoder of FIG. 2, which conforms to the structure of a parity check matrix.
Figure 7B:
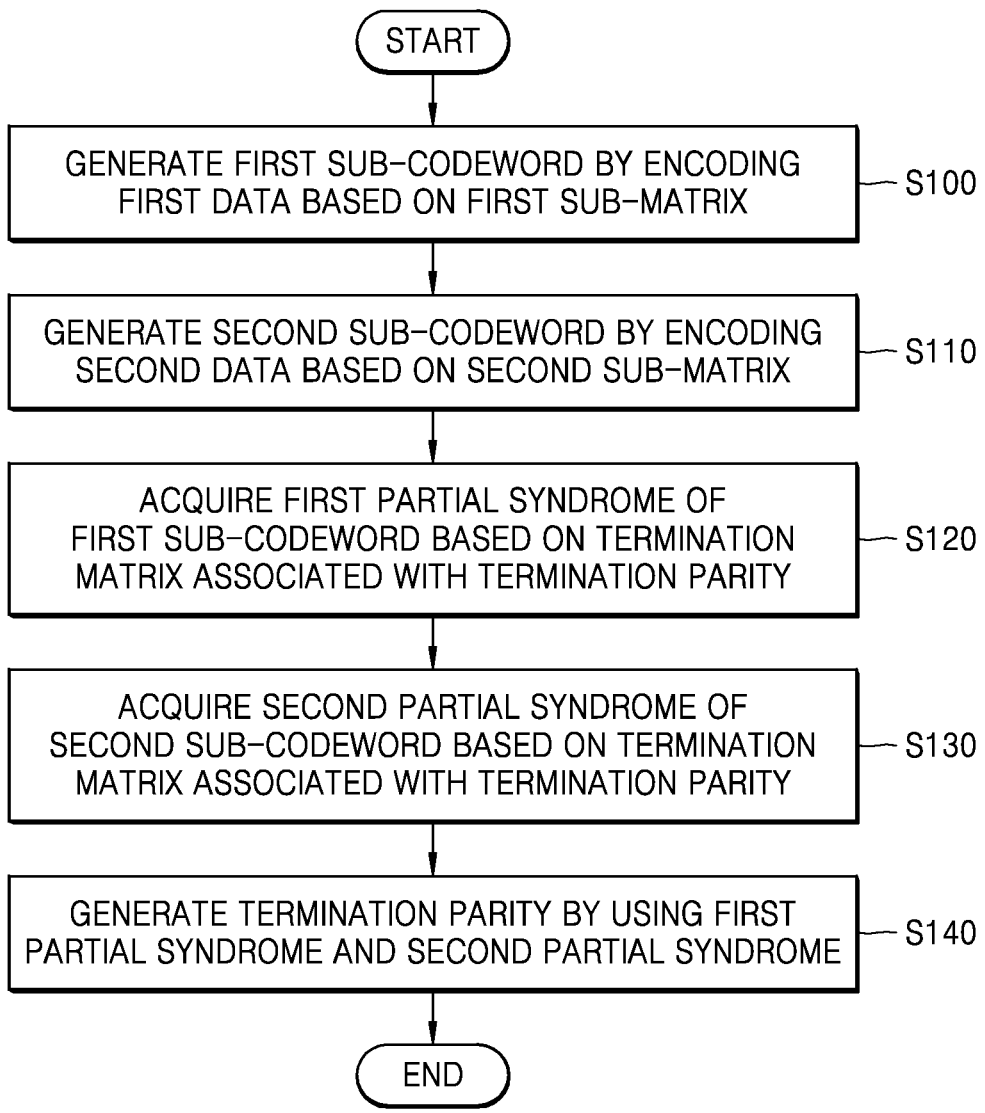
FIG. 7B is a flowchart of a method of generating termination parity in the structure of the parity check matrix of FIG. 7A.

FIG. 7A is a diagram for explaining the operation of ECC encoder 19a of FIG. 2, which conforms to the structure of a parity check matrix Hb. FIG. 7B is a flowchart of a method of generating termination parity in the structure of the parity check matrix Hb of FIG. 7A.

Referring to FIGS. 2 and 7A, the parity check matrix Hb may include first and second sub-matrices Sub_M1b and Sub_M2b, and a termination matrix BM_Tb for generating termination parity may be positioned at the boundary between the first sub-matrix Sub_M1b and the second sub-matrix Sub_M2b. That is, a part of a sixth base matrix BM6 and a part of a seventh base matrix BM7 may correspond to the termination matrix BM_Tb. ECC encoder 19a may encode first data Data_1 of the write data Data received from the host, based on the first sub-matrix Sub_M1b, to thereby generate a first sub-codeword SubCW_1b, and may encode second data Data_2 of the write data Data based on the second sub-matrix Sub_M2b to thereby generate a second sub-codeword SubCW_2b.

However, since the termination matrix BM_Tb is arranged at the boundary between the first sub-matrix Sub_M1b and the second sub-matrix Sub_M2b, unlike the structure of the parity check matrix Ha in FIG. 4, the termination parity may be associated with the first and second sub-codewords SubCW_1b and SubCW_2b. Accordingly, the termination parity may be generated using a result of the encoding of the first data Data_1 and a result of the encoding of the second data Data_2.

Referring to FIG. 7B to explain the method of generating the termination parity, the first sub-codeword SubCW_1b is generated by encoding the first data Data_1 based on the first sub-matrix Sub_M1b (operation S100), and the second sub-codeword SubCW_2b is generated by encoding the second data Data_2 based on the second sub-matrix Sub_M2b (operation S110). A first partial syndrome of the first sub-codeword SubCW_1b is acquired based on the termination matrix BM_Tb associated with the termination parity (operation S120), and a second partial syndrome of the second sub-codeword SubCW_2b is acquired based on the termination matrix BM_Tb associated with the termination parity (operation S130). The termination parity is generated using the first partial syndrome and the second partial syndrome (operation S140).

Referring back to 7A, memory controller 10 may place a termination parity sector PT_sec, which is on a codeword CWb, at the rear end of the second sub-codeword SubCW_2b. With respect to this, an operation of memory device 20 and an operation of ECC decoder 19b will be described with reference to FIGS. 8A to 9. Memory controller 10 may also place the termination parity sector PT_sec, which is on the codeword CWb, between the first sub-codeword SubCW_1b and the second sub-codeword SubCW_2b. With respect to this, an operation of memory device 20 and an operation of ECC decoder 19b will be described with reference to FIGS. 10A to 11.

Figure 8A:
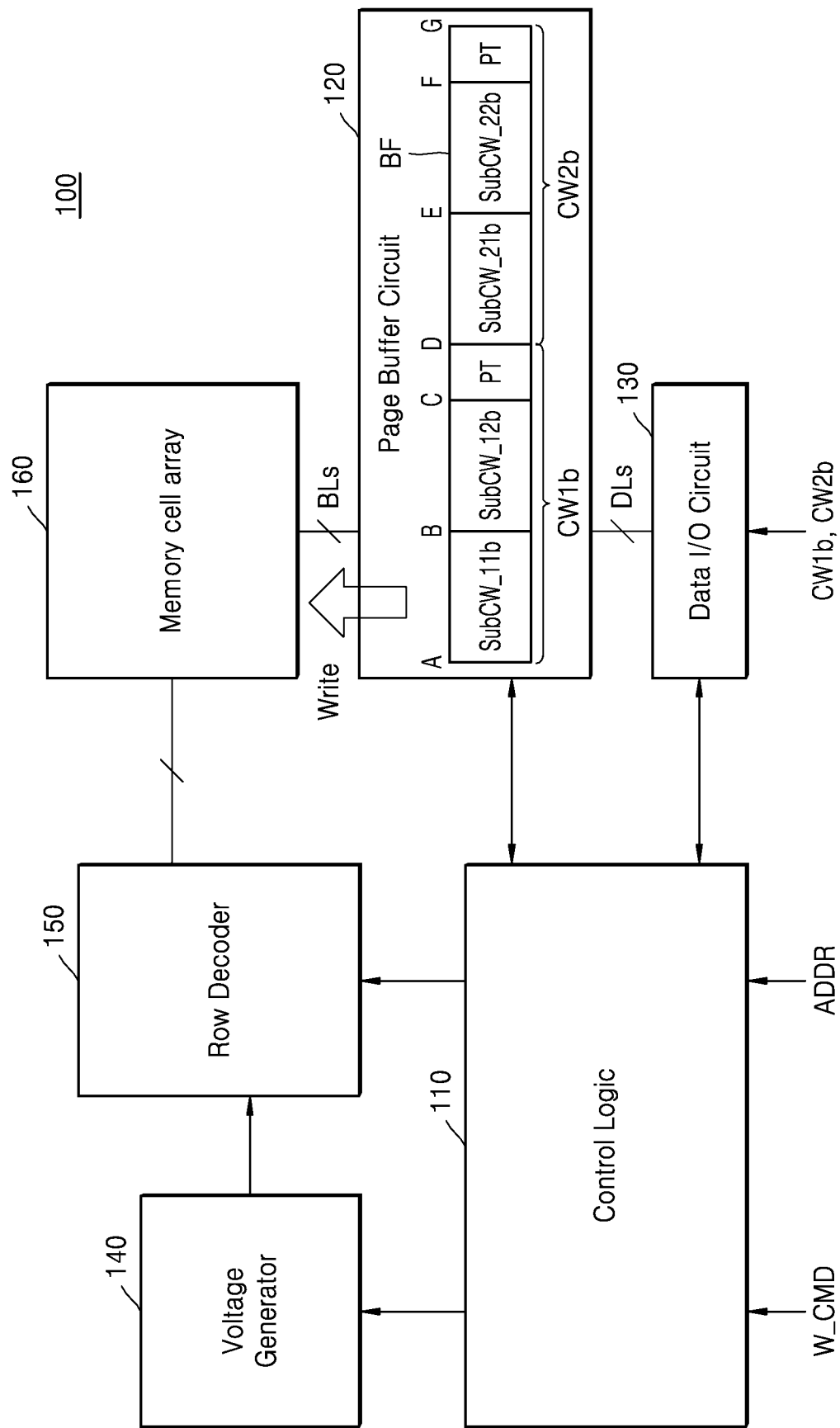
FIGS. 8A and 8B are diagrams for explaining a memory operation of an embodiment of a memory device.
Figure 8B:
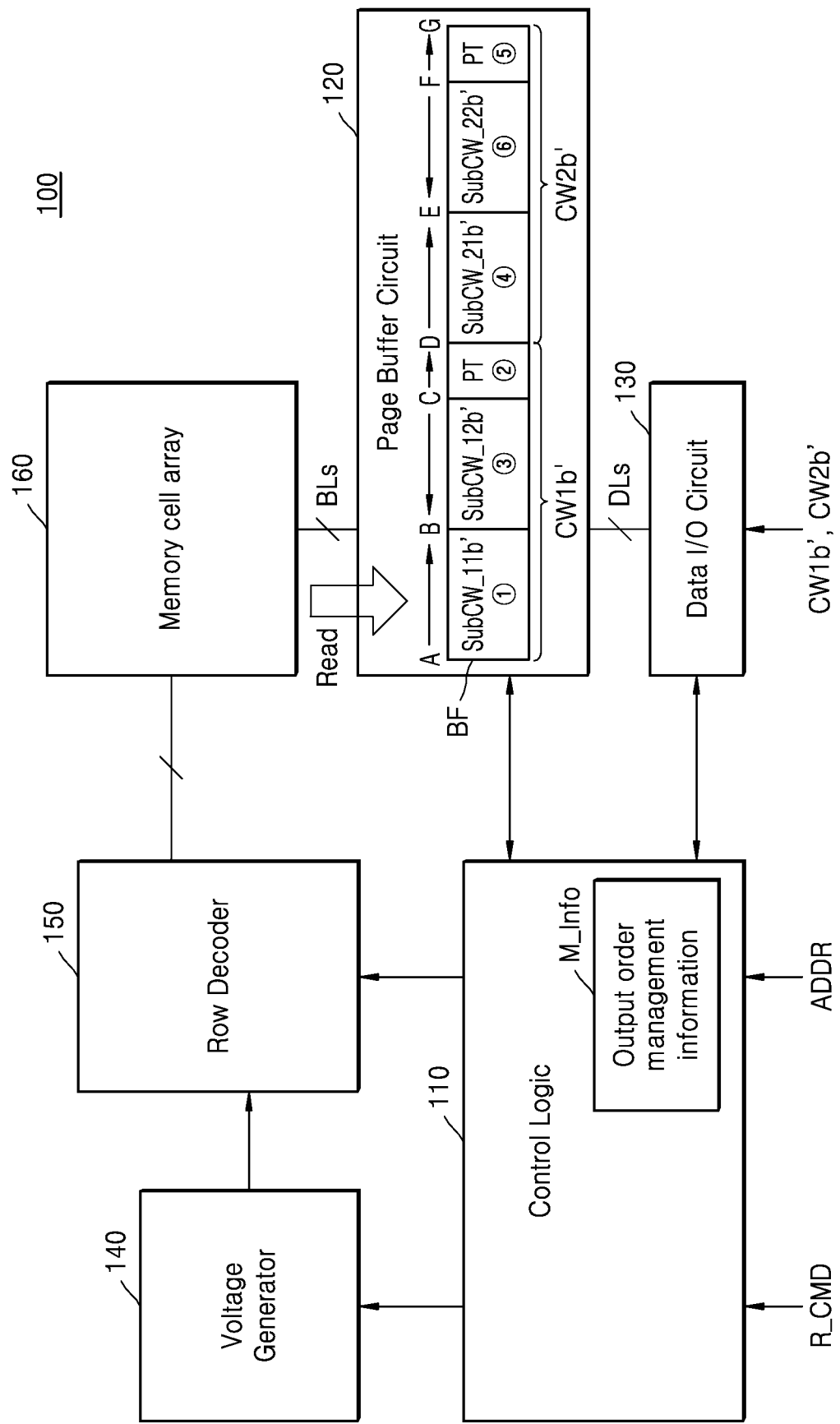

FIGS. 8A and 8B are diagrams for explaining a memory operation of an embodiment of a memory device 100. Hereinafter, the configuration of memory device 100 shown in FIGS. 8A and 8B is the same as that of memory device 100 shown in FIG. 5, and thus, detailed description thereof will be omitted.

Referring to FIG. 8A, control logic 110 may control a write operation based on a write command W_CMD and an address ADDR received from a memory controller. Data I/O circuit 130 may receive first and second codewords CW1b and CW2b. Data I/O circuit 130 may sequentially provide the received first and second codewords CW1b and CW2b to a page buffer circuit 120. Page buffer circuit 120 may include a page buffer BF having a preset size. The first codeword CW1b may be stored in the page buffer BF in the order of a first sub-codeword SubCW_11b, a second sub-codeword SubCW_12b, and a termination parity PT, and the second codeword CW2b may be stored in the page buffer BF in the order of a first sub-codeword SubCW_21b, a second sub-codeword SubCW_22b, and a termination parity PT. Page buffer circuit 120 may write the first and second codewords CW1b and CW2b stored in the page buffer BF into memory cell array 160 under the control of control logic 110.

Referring to FIG. 8B, control logic 110 may receive from the memory controller a read command R_CMD and an address ADDR in memory cell array from which data is to be read. Page buffer circuit 120 may read first and second codewords CW1b' and CW2b', stored in memory cell array 160, under the control of control logic 110 and temporarily write the first and second codewords CW1b' and CW2b' into the page buffer BF. Page buffer circuit 120 may output the first and second codewords CW1b' and CW2b' stored in the page buffer BF to the memory controller through data I/O circuit 130 under the control of control logic 110.

Control logic 110 according to an embodiment may rearrange each of the first and second codewords CW1b' and CW2b' stored in the page buffer BF, based on output sequence management information M_Info, and output rearranged codewords through data I/O circuit 130, and the memory controller may perform sequential decoding in a bit order of each of the first and second codewords CW1b' and CW2b' output from memory device 100. In an embodiment, control logic 110 may control the first codeword CW1b' to be output in the order of a first sub-codeword SubCW_11b' corresponding to an address 'A' to an address 'B', a termination parity PT corresponding to an address 'C' to an address 'D', and a second sub-codeword SubCW_12b' corresponding to an address 'B' to an address 'C', based on the output sequence management information M_Info. In addition, control logic 110 may control the second sub-codeword SubCW_12b' to be output in a bit order corresponding to a reverse address, that is, from the address 'C' to the address 'B'. As a result, the first sub-codeword SubCW_11b' may be output in the order from LSB to MSB, whereas the second sub-codeword SubCW_12b' may be output in the order from MSB to LSB. In other embodiments, the second codeword CW2b' may also be output in the same manner as the first codeword CW1b'.

The order of bits that are output by data I/O circuit 130 may be set in advance for each area of the page buffer BF. That is, a forward output and a reverse output may be set in advance according to the area of the page buffer BF. The area of the page buffer BF may be specified using the address of the page buffer BF. Such setting information may be managed by control logic 110 as the output sequence management information M_Info. However, this case is only an example embodiment and is not limited thereto. For example, an output order of the first sub-codeword SubCW_11b', second sub-codeword SubCW_12b', and termination parity PT of the first codeword CW1b' and a forward output and a reverse output of the first sub-codeword SubCW_11b' and second sub-codeword SubCW_12b' of the first codeword CW1b' may be set by one or more flag bits. In addition, an output order of the first sub-codeword SubCW_21b', second sub-codeword SubCW_22b', and termination parity PT of the second codeword CW2b' and a forward output and a reverse output of the first sub-codeword SubCW_21b' and second sub-codeword SubCW_22b' of the second codeword CW2b' may be set by one or more flag bits. Control logic 110 may set the flag bit(s) for each of the first and second codewords CW1b' and CW2b' to thereby control an output order of each of the first and second codewords CW1b' and CW2b' so that the memory controller performs a sequential decoding in a bit order of each of the first and second codewords CW1b' and CW2b' output by memory device 100.

Figure 9:
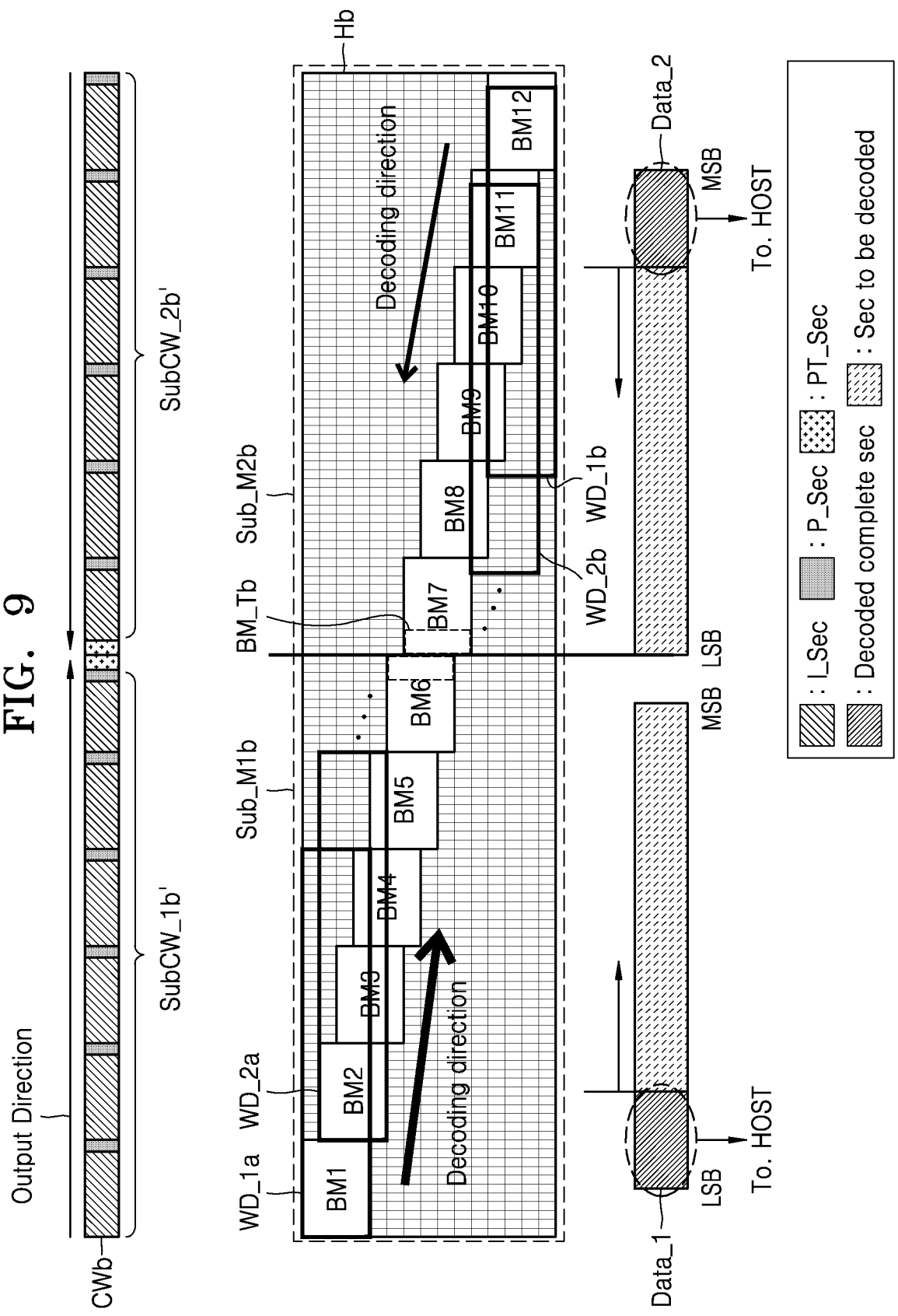
FIG. 9 is a diagram for explaining the operation of the ECC decoder of FIG. 2, which conforms to the structure of a parity check matrix.

FIG. 9 is a diagram for explaining the operation of ECC decoder 19b of FIG. 2, which conforms to the structure of a parity check matrix Hb. In FIG. 9, it is assumed that a codeword CWb' is output from memory device 20 in the manner described with reference to FIG. 8B.

Referring to FIGS. 2 and 9, memory device 20 may sequentially output a first sub-codeword SubCW_1b' and termination parity to memory controller 10. Memory device 20 may output second sub-codeword SubCW_2b' to memory controller 10 in the order from MSB to LSB. ECC decoder 19b may receive the first sub-codeword SubCW_1b' and the termination parity and immediately decode the first sub-codeword SubCW_1b' by using first sliding windows WD_1a, WD_2b, . . . in a first direction.

Since ECC decoder 19b receives the second sub-codeword SubCW_2b' in the order from MSB to LSB, ECC decoder 19b may perform decoding on the second sub-codeword SubCW_2b' in the order from MSB to LSB by using second sliding windows WD_1b, WD_2b, . . . in a second direction, in this case opposite to the first direction. Other specific operations of ECC decoder 19b are similar to those described with reference to FIG. 6B, and thus a detailed description thereof will be omitted.

Figure 10A:
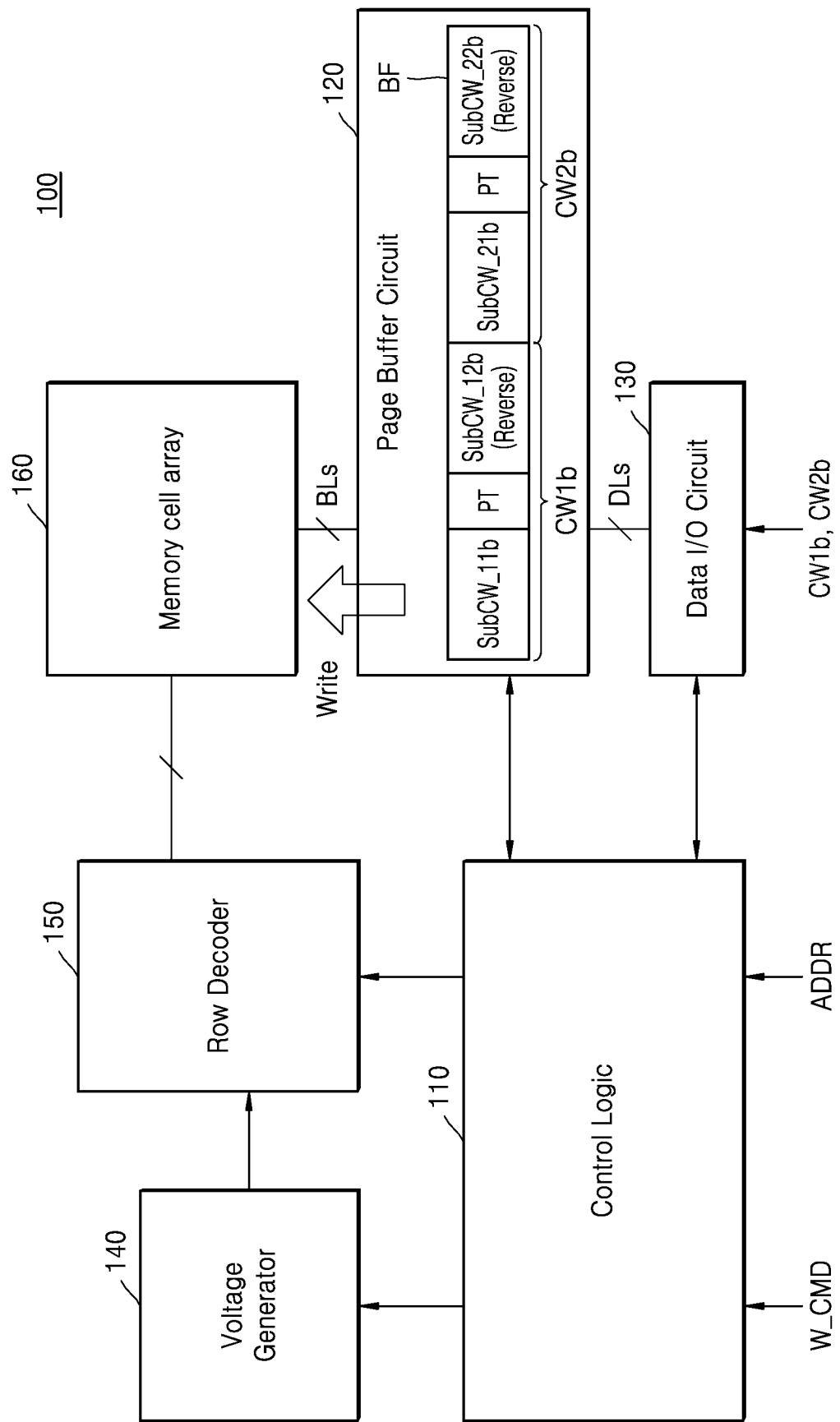
FIGS. 10A and 10B are diagrams for explaining a memory operation of an embodiment of a memory device.
Figure 10B:
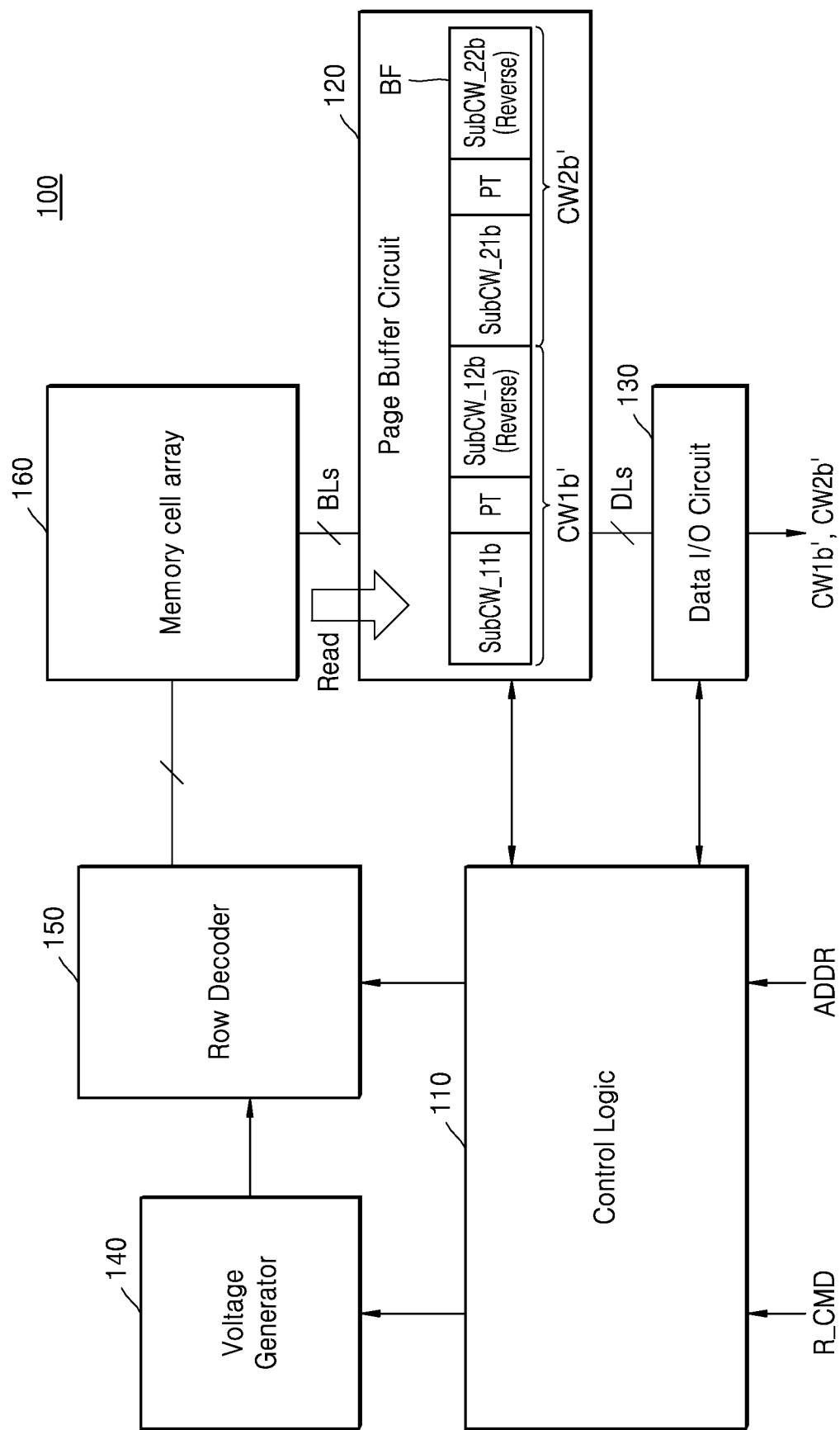

FIGS. 10A and 10B are diagrams for explaining a memory operation of an example embodiment of memory device 100. Hereinafter, the configuration of memory device 100 has been described with reference to FIG. 5, and therefore, detailed description thereof will be omitted.

Referring to FIG. 10A, control logic 110 may receive a write command W_CMD and an address ADDR from a memory controller, and unlike in FIG. 8A, data I/O circuit 130 may receive rearranged codewords CW1b and CW2b from the memory controller. In an embodiment, a first codeword CW1b may be stored in a page buffer BF of page buffer circuit 120 in the order of a first sub-codeword SubCW_11b, a termination parity PT, and a reversed second sub-codeword SubCW_12b, and a second codeword CW2b may be stored in the page buffer BF in the order of a first sub-codeword SubCW_21b, a termination parity PT, and a reversed second sub-codeword SubCW_22b. Page buffer circuit 120 may write the first and second codewords CW1b and CW2b stored in the page buffer BF into memory cell array 160 under the control of control logic 110.

Referring to FIG. 10B, control logic 110 may receive a read command R_CMD and an address ADDR from the memory controller, and page buffer circuit 120 may read codewords CW1b' and CW2b', stored in memory cell array 160, under the control of control logic 110 and temporarily write the read codewords CW1b' and CW2b' into the page buffer BF. Page buffer circuit 120 may output the codewords CW1b' and CW2b' stored in the page buffer BF to the memory controller through data I/O circuit 130 under the control of control logic 110.

Figure 11:
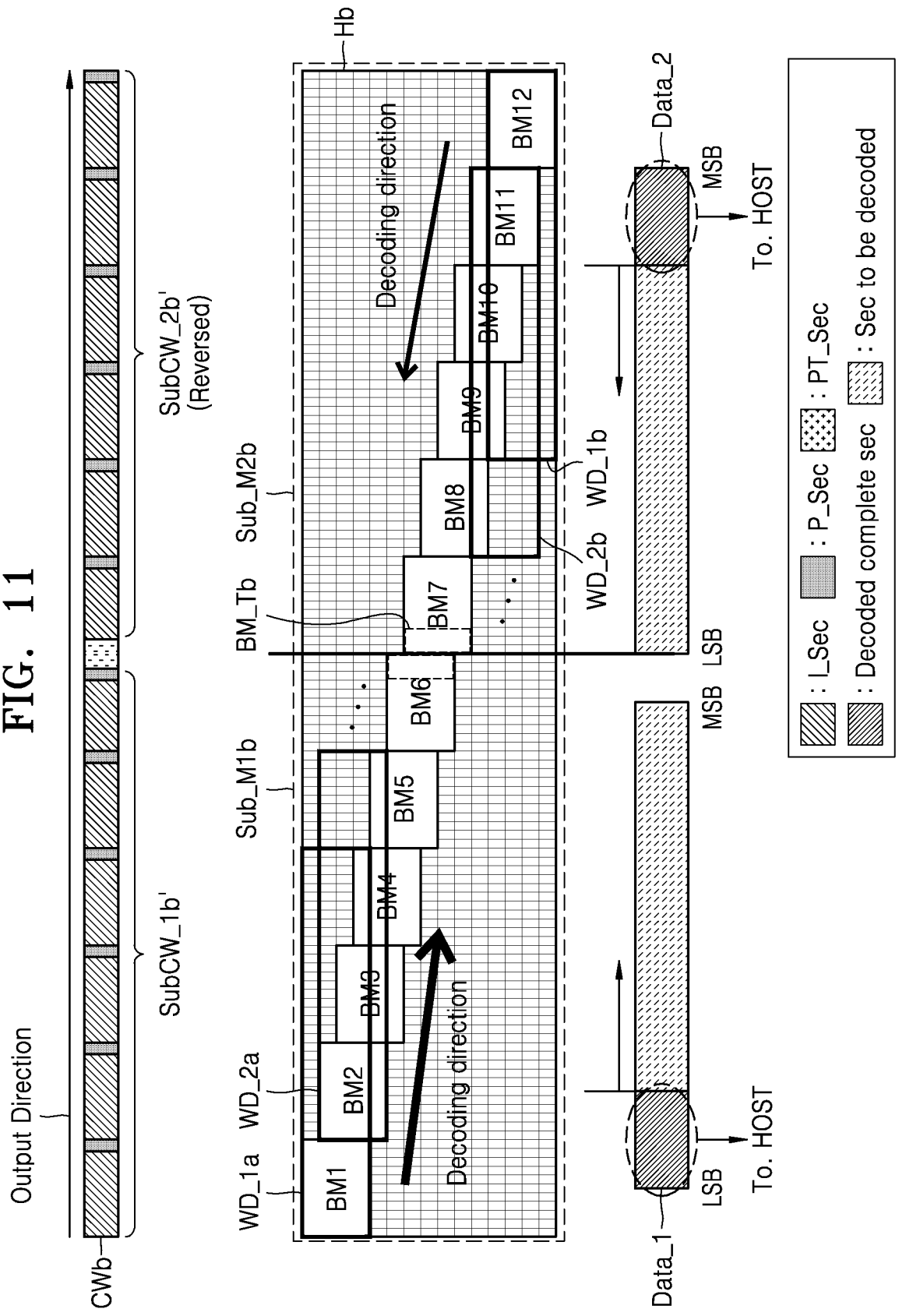
FIG. 11 is a diagram for explaining the operation of the ECC decoder of FIG. 2, which conforms to the structure of a parity check matrix.

FIG. 11 is a diagram for explaining the operation of ECC decoder 19b of FIG. 2, which conforms to the structure of a parity check matrix Hb. In FIG. 11, it is assumed that a codeword CWb' is output from memory device 20 in the manner described with reference to FIG. 10B.

Referring to FIG. 2 and FIG. 11, memory device 20 may output a first sub-codeword SubCW_1b', termination parity, and a reversed second sub-codeword SubCW_2b' to the memory controller in the order from LSB to MSB. Since ECC decoder 19b receives the reversed second sub-codeword SubCW_2b' in the order from LSB to MSB, but the second sub-codeword SubCW_2b' has a form reversed after encoding is completed in memory controller 10, ECC decoder 19b may decode the reversed second sub-codeword SubCW_2b' in the order from LSB to MSB by using second sliding windows WD_1b, WD_2b, . . . in a second direction which may be opposite to the first direction. Other specific operations of ECC decoder 19b are similar to those described with reference to FIG. 9, and detailed description thereof will be omitted.

Figure 12A:
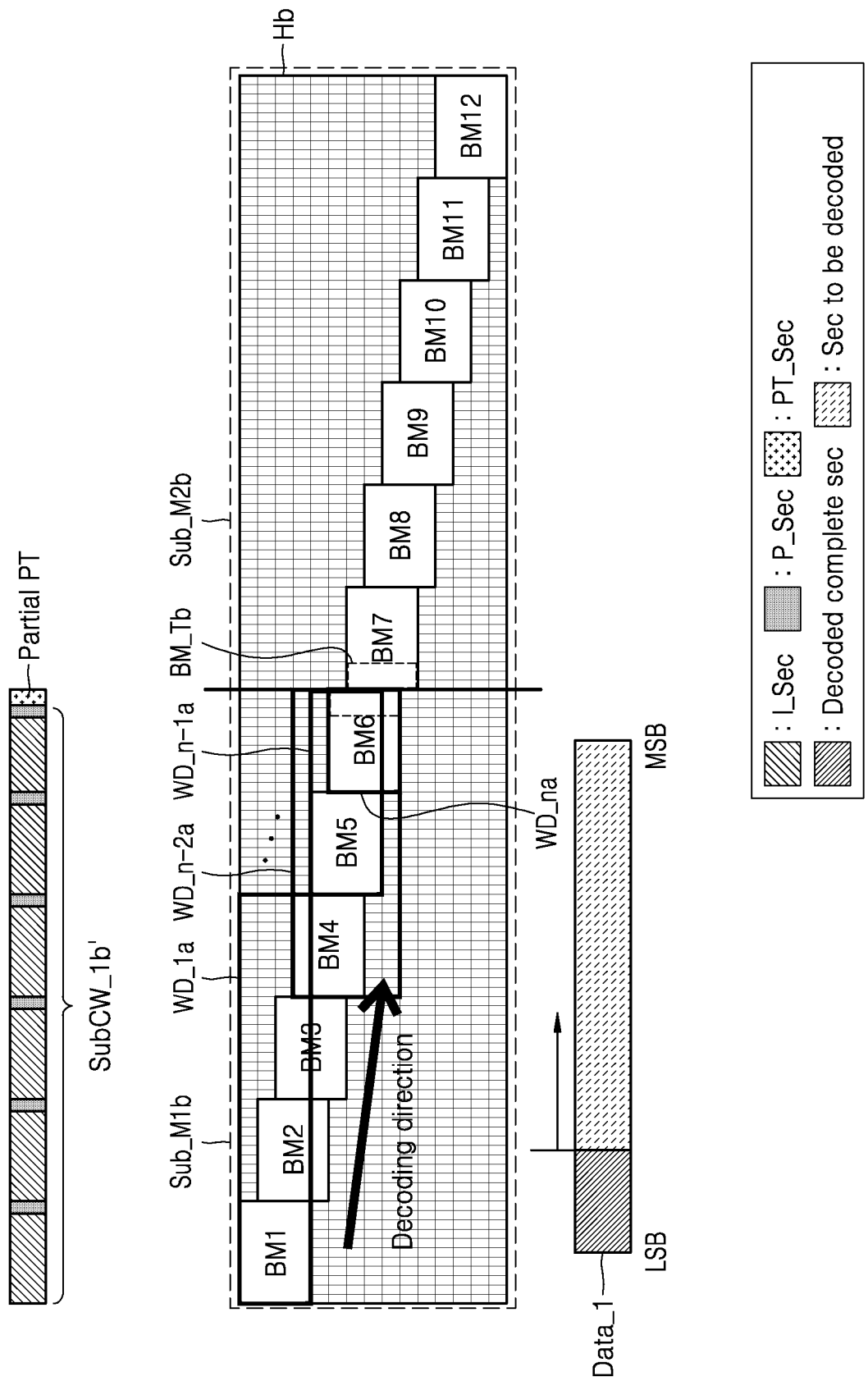
FIGS. 12A and 12B are diagrams for explaining a decoding operation for a first sub-codeword of the ECC decoder of FIG. 2, which conforms to the structure of a parity check matrix.
Figure 12B:
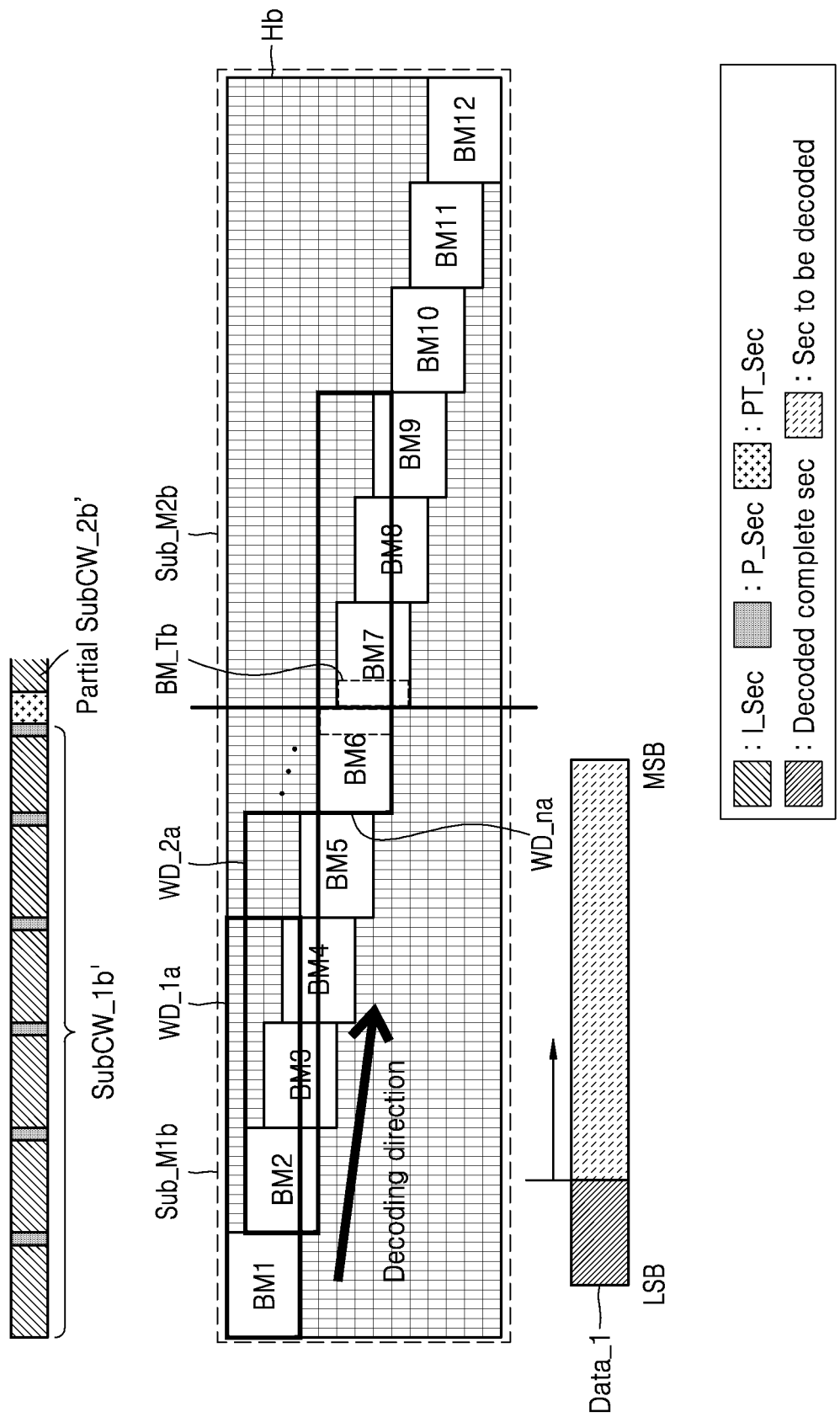

FIGS. 12A and 12B are diagrams for explaining a decoding operation for a first sub-codeword SubCW_1b' of ECC decoder 19b of FIG. 2, which conforms to the structure of a parity check matrix Hb.

Referring to FIGS. 2 and 12A, ECC decoder 19b may decode the first sub-codeword SubCW_1b' based on only a first sub-matrix Sub_M1b. That is, ECC decoder 19b may change the sizes of first sliding windows WD_1a to WD_na in a first direction so that the first sliding windows WD_1a to WD_na in the first direction may be set only within the first sub-matrix Sub_M1b. As an example, ECC decoder 19b may set the last first sliding window WD_na to include a part of a termination matrix BM_Tb. ECC decoder 19b may decode the first sub-codeword SubCW_1b' by using the first sliding windows WD_1a to WD_na in the first direction, which have variable sizes, and a termination parity Partial PT associated with a part of the termination matrix BM_Tb. In this way, the time required to decode the first sub-codeword SubCW_1b' may be reduced, and as a result, the data output latency of memory system 1 may be improved.

Referring to FIGS. 2 and 12B, ECC decoder 19b may decode the first sub-codeword SubCW_1b' based on the first sub-matrix Sub_M1b and a part of a second sub-matrix Sub_M2b. That is, ECC decoder 19b may set first sliding windows WD_1a to WD_na in a first direction, which have a fixed size, to include a part of the second sub-matrix Sub_M2b. For example, ECC decoder 19b may set the last first sliding window WD_na to include a part of the second sub-matrix Sub_M2b. ECC decoder 19b may decode the first sub-codeword SubCW_1b' by using the first sliding windows WD_1a to WD_na in the first direction, a termination parity PT, and a part Partial SubCW_2b' of a second sub-codeword associated with a part of a second sub-matrix Sub_M2b. ECC decoder 19b may selectively read the part Partial SubCW_2b' of the second sub-codeword or the termination parity PT from a buffer in memory controller 10. In this way, bit error correction capability for the first sub-codeword SubCW_1b' may be improved, and thus the reliability of memory system 1 may be improved.

Figure 13:
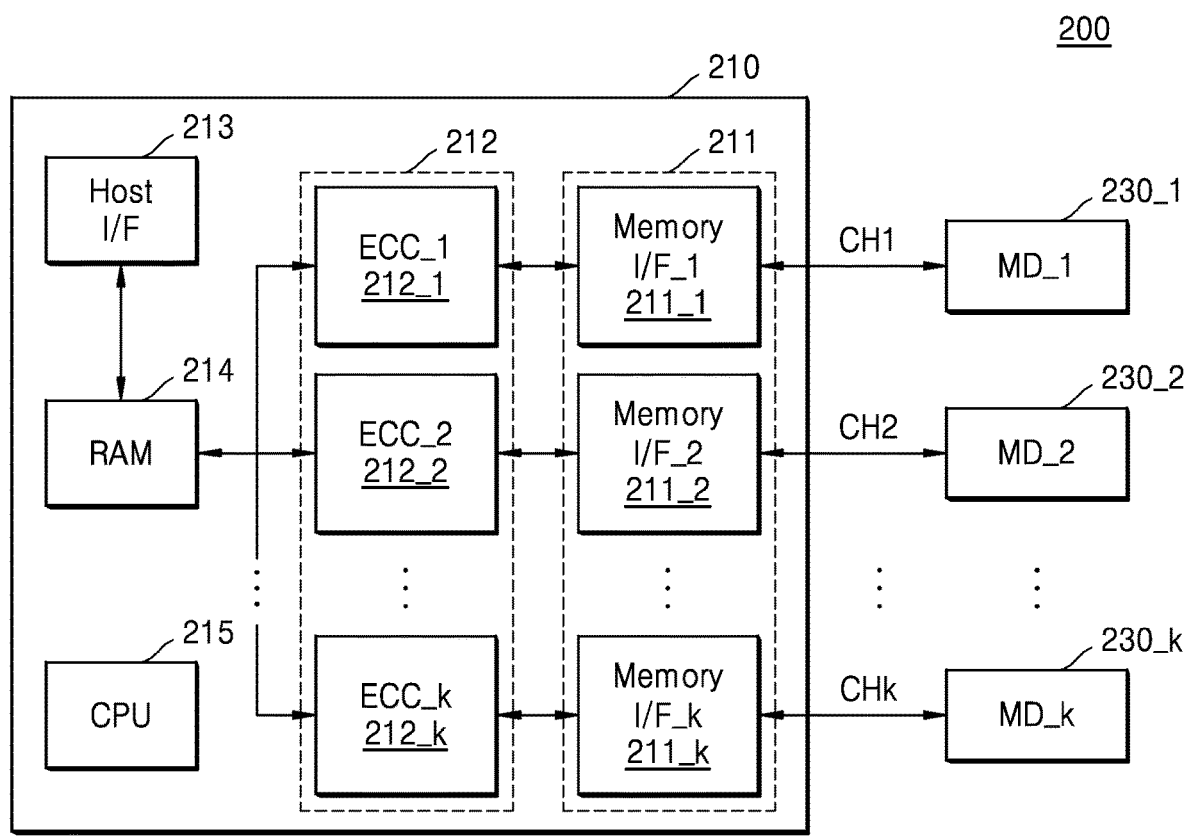
FIG. 13 is a block diagram of an embodiment of a memory system.

FIG. 13 is a block diagram of an embodiment of a memory system 200.

Referring to FIG. 13, memory system 200 may include a memory controller 210 and a plurality of memory devices 230_1 to 230_k. Memory controller 210 may include a memory interface unit 211, an ECC logic element 212, a host interface 213, a RAM 214 and a central processing unit 215. In various embodiments, ECC logic element 212 may comprise a logic circuit and/or a processor configured to perform logic operations in response to instructions stored in a memory, etc. Hereinafter, ECC logic element 212 is referred to as "ECC logic 212" for convenience of description. ECC logic 212 may include first to kth ECC circuits 212_1 to 212_k, and memory interface unit 211 may include first to kth memory interfaces 211_1 to 211_k. Memory interfaces 211_1 to 211_k may be connected to memory devices 230_1 to 230_k via channels CH1 to CHk, respectively. Each of ECC circuits 212_1 to 212_k may divide data received together with a write request from a host and perform parallel encoding to thereby generate sub-codewords. The generated sub-codewords may be stored in memory devices 230_1 to 230_k in a distributed manner. And then, upon receiving a read request for data from the host, each of ECC circuits 212_1 to 212_k may receive the sub-codewords from memory devices 230_1 to 230_k through memory interface unit 211. Each of ECC circuits 212_1 to 212_k may perform parallel decoding on the received sub-codewords, and then may merge data generated as a result of decoding by using RAM 214 and output the merged data to the host through host interface 213. However, the embodiment of FIG. 13 is only an example and is not limited thereto, and encoding/decoding operations may be performed by various methods according to an encoding/decoding operation policy of memory controller 210.

FIGS. 14A, 14B, 14C, and 14D are diagrams for explaining embodiments of encoding and decoding methods.

Figure 14A:
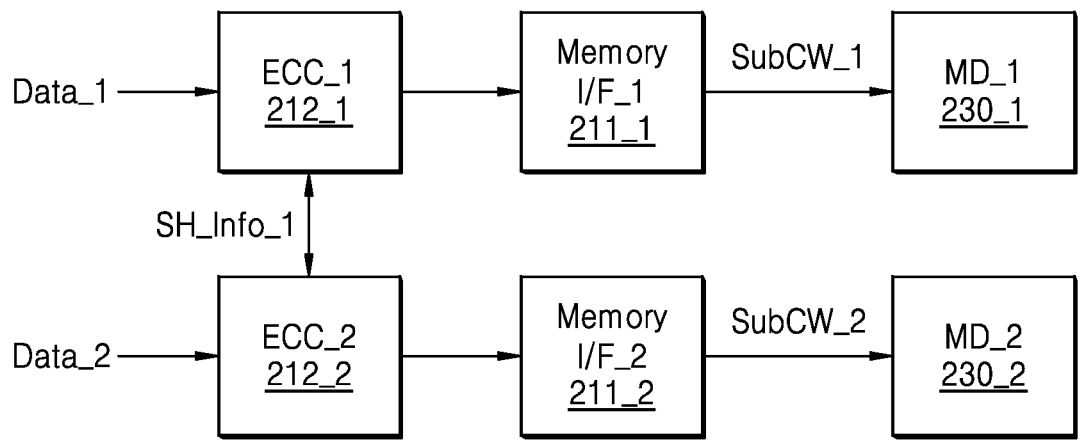
FIGS. 14A, 14B, 14C, and 14D are diagrams for explaining encoding and decoding methods according to embodiments.

Referring to FIG. 14A, write data received from a host may be divided into first data Data_1 and second data Data_2, and a first ECC circuit 212_1 and a second ECC circuit 212_2 may receive the first data Data_1 and the second data Data_2, respectively. First ECC circuit 212_1 may encode the first data Data_1, and second ECC circuit 212_2 may encode the second data Data_2. The encoding operation of first ECC circuit 212_1 and the encoding operation of second ECC circuit 212_2 may be performed in parallel.

First ECC circuit 212_1 and second ECC circuit 212_2 may share first information SH_Info_1 necessary for their respective encoding operations. The first information SH_Info_1 may include some or all of the first data Data_1, some or all of the second data Data_2, and at least one of an encoding result for the first data Data_1 and an encoding result for the second data Data_2. First ECC circuit 212_1 and second ECC circuit 212_2 may use the first information SH_Info_1 when performing the respective encoding operations.

First ECC circuit 212_1 may output a first sub-codeword SubCW_1 generated by encoding the first data Data_1 to a first memory device 230_1 through a first memory interface 211_1, and second ECC circuit 212_2 may output a second sub-codeword SubCW_2 generated by encoding the second data Data_2 to a second memory device 230_2 through a second memory interface 211_2. First memory device 230_1 may store the first sub-codeword SubCW_1, and second memory device 230_2 may store the second sub-codeword SubCW_2.

Figure 14B:
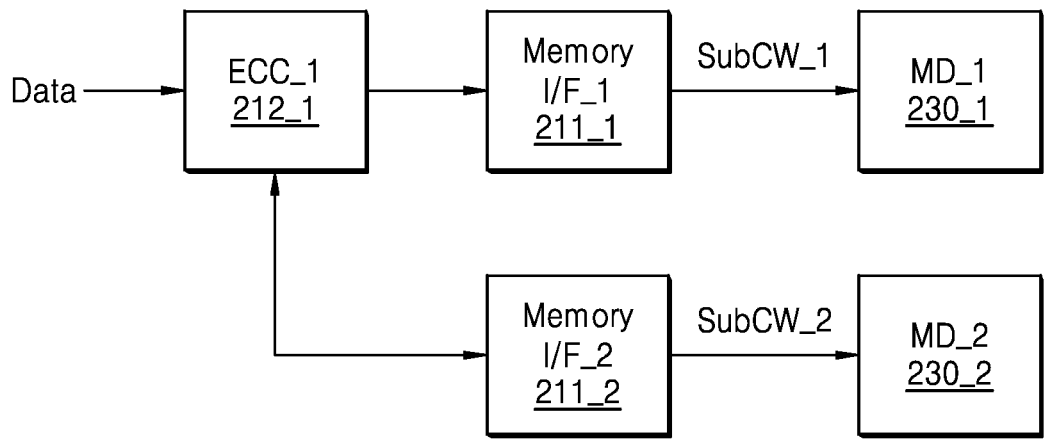

Referring to FIG. 14B, unlike in FIG. 14A, first ECC circuit 212_1 may receive write data Data, divide the write data Data into first data and second data, encode the first data and the second data, and output first sub-codeword SubCW_1 and second sub-codeword SubCW_2.

Figure 14C:
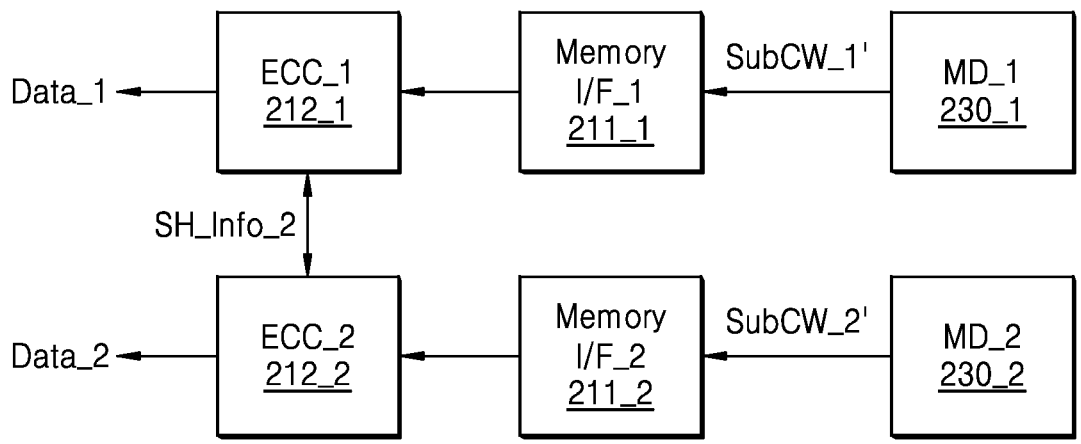

Referring to FIG. 14C, first ECC circuit 212_1 may receive a first sub-codeword SubCW_1' from first memory device 230_1 through first memory interface 211_1 and decode the first sub-codeword SubCW_1'. Second ECC circuit 212_2 may receive a second sub-codeword SubCW_2' from second memory device 230_2 through second memory interface 211_2 and decode the second sub-codeword SubCW_2'. The decoding operation of first ECC circuit 212_1 and the decoding operation of the second ECC circuit 212_2 may be performed in parallel.

First ECC circuit 212_1 and second ECC circuit 212_2 may share second information SH_Info_2 necessary for their respective decoding operations. The second information SH_Info_2 may include a part or the entirety of the first sub-codeword SubCW_1', a part or the entirety of the second sub-codeword SubCW_2', and at least one of a decoding result for the first sub-codeword SubCW_1' and a decoding result for the second sub-codeword SubCW_2'. First ECC circuit 212_1 and second ECC circuit 212_2 may use the second information SH_Info_2 when performing the respective decoding operations.

First ECC circuit 212_1 may output first data Data_1 generated by decoding the first sub-codeword SubCW_1', and second ECC circuit 212_2 may output second data Data_2 generated by decoding the second sub-codeword SubCW_2'.

Figure 14D:
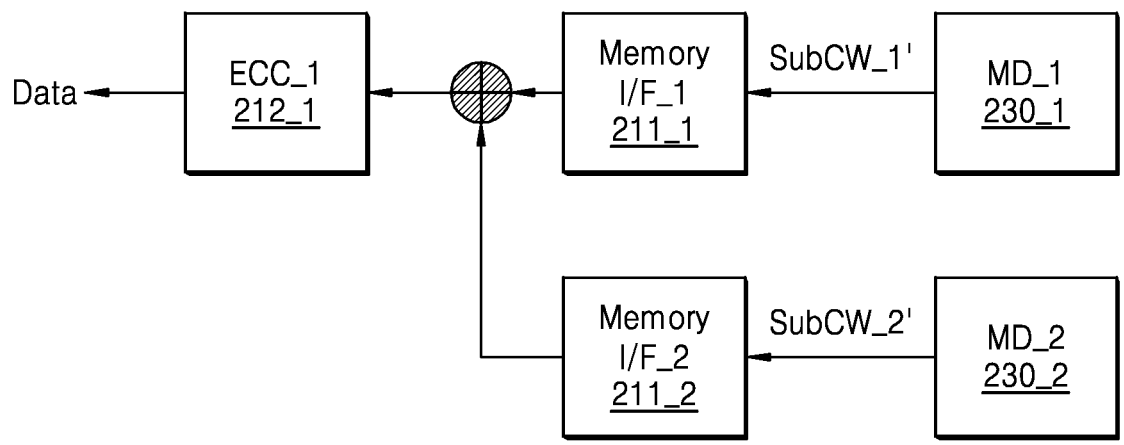

Referring to FIG. 14D, unlike in FIG. 14C, first ECC circuit 212_1 may receive a codeword generated by merging a first sub-codeword SubCW_1' and a second sub-codeword SubCW_2'. First ECC circuit 212_1 may output data Data generated by decoding the codeword.

Figure 15:
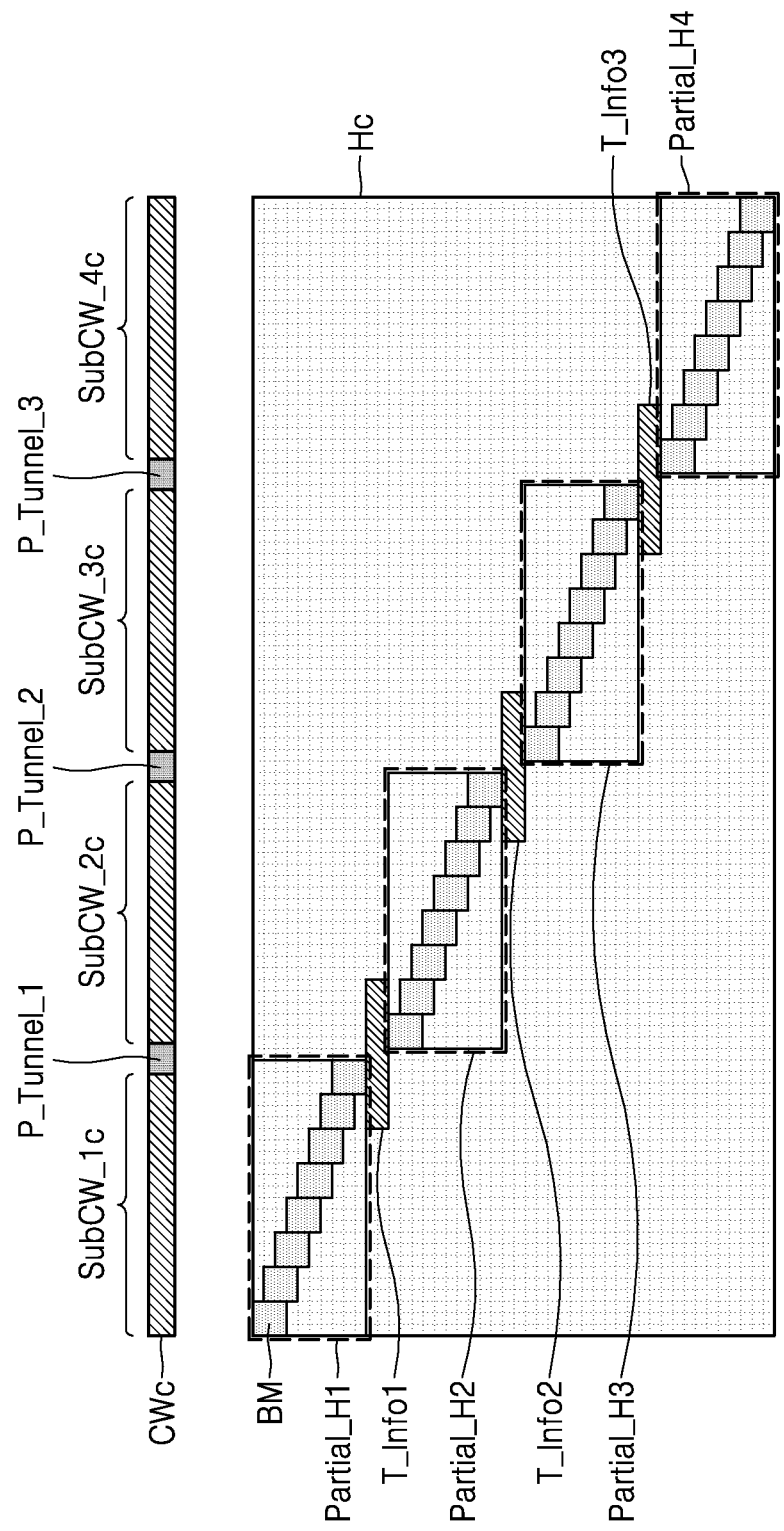
FIG. 15 is a diagram for explaining the operation of the ECC encoder of FIG. 2, which conforms to the structure of a parity check matrix.

FIG. 15 is a diagram for explaining the operation of ECC encoder 19a of FIG. 2, which conforms to the structure of a parity check matrix Hc.

Referring to FIGS. 2 and 15, the parity check matrix Hc may include first to fourth partial parity check matrices Partial_H1 to Partial_H4. Here, the first to fourth partial parity check matrices Partial_H1 to Partial_H4 may be independent matrices and may not be related to each other. Due to independent characteristics of the first to fourth partial parity check matrices Partial_H1 to Partial_H4, correction capability may be degraded during encoding/decoding using the parity check matrix Hc. To compensate for this, the parity check matrix Hc may further include first to third tunneling information T_Info1 to T_Info3. The first tunneling information T_Info1 may be associated with the first and second partial parity check matrices Partial_H1 and Partial_H2 and a first tunneling check equation may be derived through the first tunneling information T_Info1. The second tunneling information T_Info2 may be associated with the second and third partial parity check matrices Partial_H2 and Partial_H3 and a second tunneling check equation may be derived through the second tunneling information T_Info2. The third tunneling information T_Info3 may be associated with the third and fourth partial parity check matrices Partial_H3 and Partial_H4 and a third tunneling check equation may be derived through the third tunneling information T_Info3.

ECC encoder 19a may encode first data of write data Data received from a host, based on the first partial parity check matrix Partial_H1, to thereby generate a first sub-codeword SubCW_1c, encode second data of the write data Data, based on the second partial parity check matrix Partial_H2, to thereby generate a second sub-codeword SubCW_2c, encode third data of the write data Data, based on the third partial parity check matrix Partial_H3, to thereby generate a third sub-codeword SubCW_3c, and encode fourth data of the write data Data, based on the fourth partial parity check matrix Partial_H4, to thereby generate a fourth sub-codeword SubCW_4c. In addition, ECC encoder 19a may generate a first tunneling parity P_Tunnel_1 by using the first tunneling information T_Info1, generate a second tunneling parity P_Tunnel_2 by using the second tunneling information T_Info2, and generate a third tunneling parity P_Tunnel_3 by using the third tunneling information T_Info3. The first to third tunneling parities P_Tunnel_1 to P_Tunnel_3 may satisfy the first to third tunneling check equations, respectively.

ECC encoder 19a may generate a codeword CWc including the first to fourth sub-codewords SubCW_1c to SubCW_4c and the first to third tunneling parities P_Tunnel_1 to P_Tunnel_3 by encoding the write data Data in the manner described above. A sub-codeword size described with reference to FIG. 15 and thereafter may be equal to or different from that described before FIG. 15.

Figure 16:
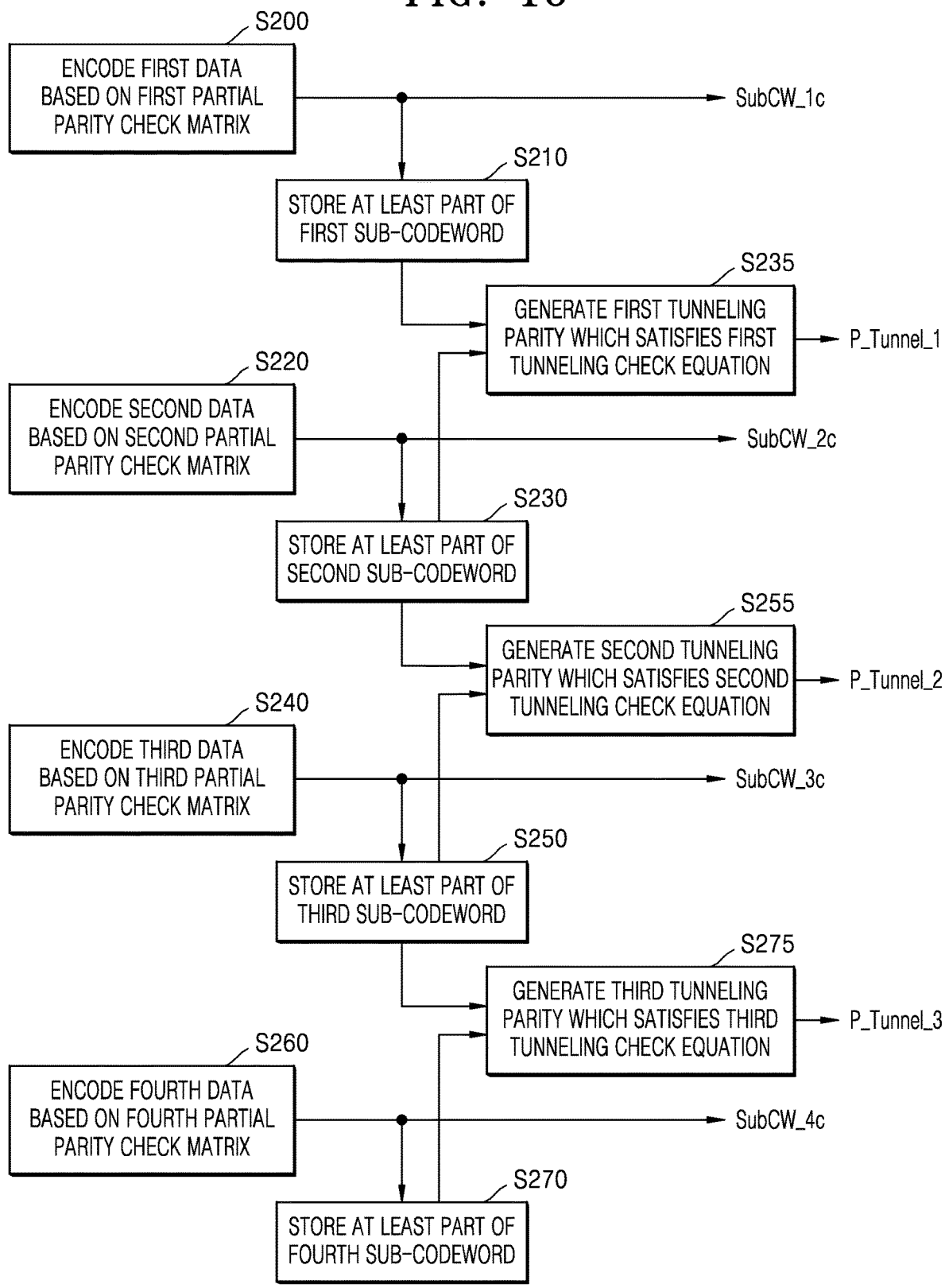
FIG. 16 is a flowchart illustrating an embodiment of a method of generating a tunneling parity.

FIG. 16 is a flowchart illustrating an embodiment of a method of generating a tunneling parity.

Referring to FIGS. 2, 15 and 16, ECC encoder 19a may encode first data based on the first partial parity check matrix Partial_H1 (operation S200). ECC encoder 19a may store at least a part of the first sub-codeword SubCW_1c in a buffer in the memory controller 10 (operation S210). ECC encoder 19a may encode second data based on the second partial parity check matrix Partial_H2 (operation S220). ECC encoder 19a may store at least a part of the second sub-codeword SubCW_2c in the buffer in memory controller 10 (operation S230). Next, ECC encoder 19a may generate the first tunneling parity P_Tunnel_1, which satisfies the first tunneling check equation derived by the first tunneling information T_Info_1, by using the at least a part of the first sub-codeword SubCW_1c stored in the buffer and the at least a part of the second sub-codeword SubCW_2c stored in the buffer (operation S235). In an embodiment, ECC encoder 19a may determine a value, at which a syndrome of a check matrix for tunneling becomes '0', as the first tunneling parity P_Tunnel_1 by using the first sub-codeword SubCW_1c and the second sub-codeword SubCW_2c.

ECC encoder 19a may encode third data based on the third partial parity check matrix Partial_H3 (operation S240). ECC encoder 19a may store at least a part of the third sub-codeword SubCW_3c in the buffer in memory controller 10 (operation S250). Next, ECC encoder 19a may generate the second tunneling parity P_Tunnel_2, which satisfies the second tunneling check equation derived by the second tunneling information T_Info_2, by using the at least a part of the second sub-codeword SubCW_2c stored in the buffer and the at least a part of the third sub-codeword SubCW_3c stored in the buffer (operation S255).

ECC encoder 19a may encode fourth data based on the fourth partial parity check matrix Partial_H4 (operation S260). ECC encoder 19a may store at least a part of the fourth sub-codeword SubCW_4c in the buffer in memory controller 10 (operation S270). Next, ECC encoder 19a may generate the third tunneling parity P_Tunnel_3, which satisfies the third tunneling check equation derived by the third tunneling information T_Info_3, by using the at least a part of the third sub-codeword SubCW_3c stored in the buffer and the at least a part of the fourth sub-codeword SubCW_4c stored in the buffer (operation S275).

Figure 17:
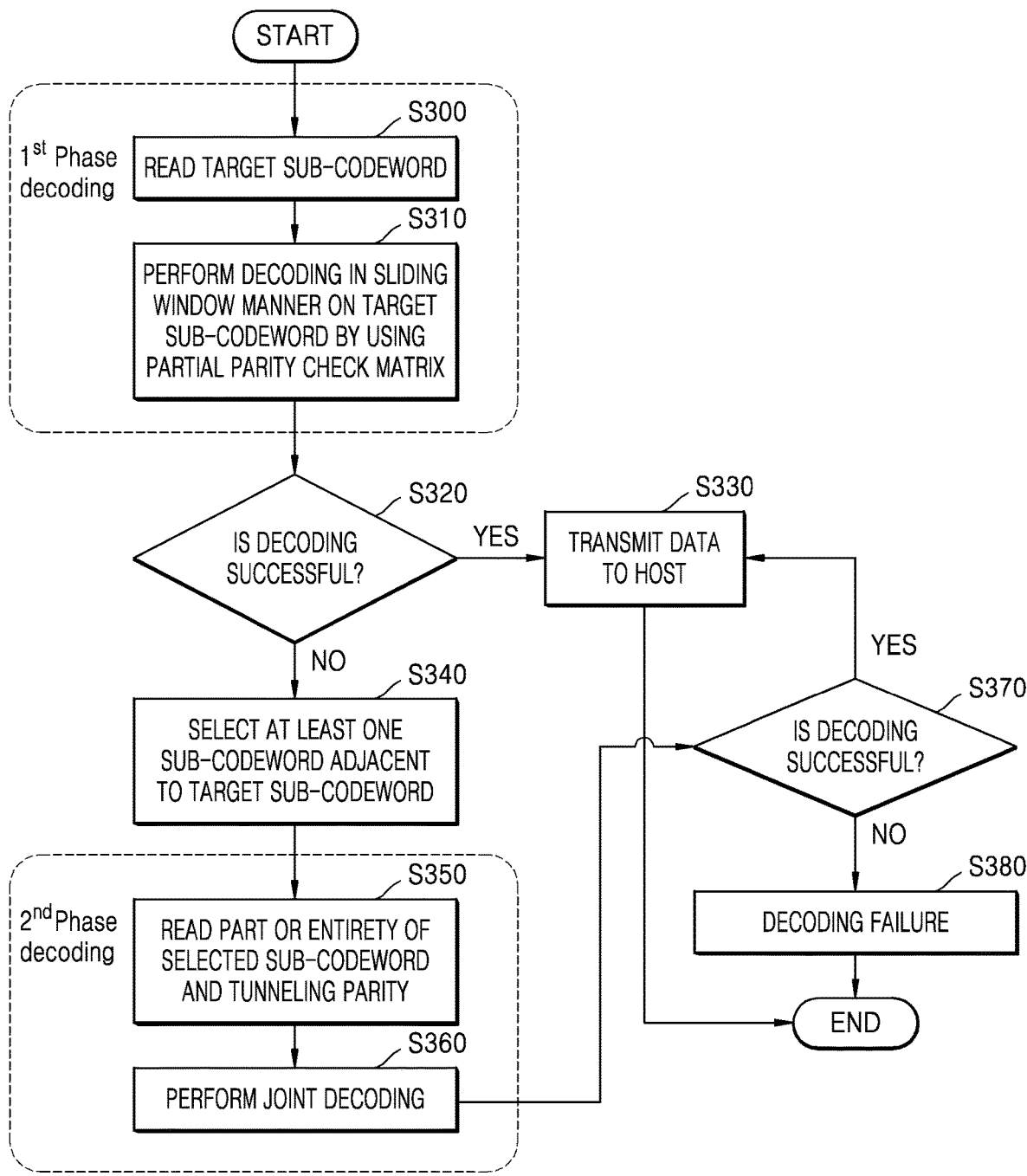
FIG. 17 is a flowchart illustrating an embodiment of a decoding operation.

FIG. 17 is a flowchart illustrating an embodiment of a decoding operation. Hereinafter, the decoding operation is described by focusing on the structure of the parity check matrix Hc of FIG. 16. However, embodiments are not limited thereto, and the decoding operation may be applied to the structures of the parity check matrices Ha and Hb of FIGS. 4 and 7A.

An ECC decoder may perform a decoding operation over two phases. First, the ECC decoder may read a target sub-codeword from a buffer in a memory controller (operation S300). The ECC decoder may perform decoding in a sliding window manner on the target sub-codeword by using one partial parity check matrix associated with the target sub-codeword (operation S310). A first phase decoding operation may include operations S300 and S310. Next, the ECC decoder may determine whether the first phase decoding operation is successful (operation S320). When it is determined that the first phase decoding operation is successful (operation S320, YES), data generated through decoding may be transmitted to a host (operation S330). When it is determined that the first phase decoding operation fails (operation S320, NO), the ECC decoder may select at least one sub-codeword adjacent to the target sub-codeword (operation S340). The ECC decoder may further read a part or the entirety of the selected sub-codeword and a tunneling parity from the buffer in the memory controller (operation S350). Next, the ECC decoder may perform joint decoding in a sliding window manner by using a partial parity check matrix, tunneling information, and the like associated with a part of the selected sub-codeword (operation S360). A second phase decoding operation may include operations S350 and S360. Next, the ECC decoder may determine whether the second phase decoding operation is successful (operation S370). When it is determined that the second phase decoding operation is successful (operation S370, YES), data generated through decoding may be transmitted to the host (operation S330). When it is determined that the second phase decoding operation fails (operation S370, NO), the ECC decoder may determine that decoding is unsuccessful (operation S380) and end the decoding operation for the target sub-codeword. However, this case is only an example embodiment, and the decoding operation may be performed in more phases until the decoding for the target sub-codeword is successful. Further, as the decoding operation is performed in more phases, the ECC decoder may need more decoding-related data.

FIGS. 18, 19A, 19B, 19C, 20A and 20B are diagrams for explaining various embodiments of the second phase decoding operation of FIG. 17.

Figure 18:
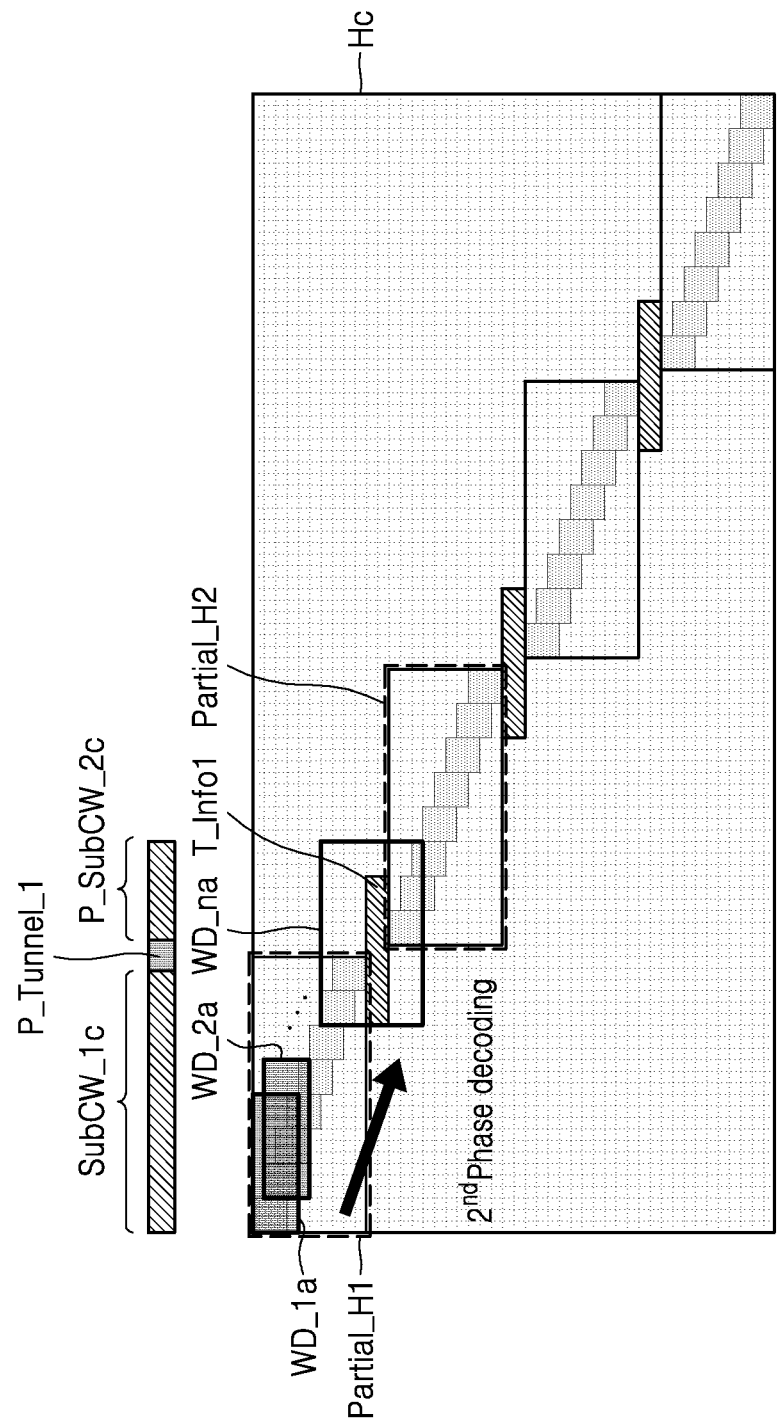

Referring to FIGS. 2 and 18, ECC decoder 19b may further read a first tunneling parity P_Tunnel_1 and a part P_SubCW_2c of a second sub-codeword from a buffer in memory controller 10 in a second phase decoding operation, and may variably set the sizes of first sliding windows WD_1a to WD_na in a first direction so that the first sliding windows WD_1a to WD_na may include first tunneling information T_Info1 and a part of a second partial parity check matrix Partial_H2. For example, ECC decoder 19b may set the last first sliding window WD_na to include the first tunneling information T_Info1 and the part of the second partial parity check matrix Partial_H2. ECC decoder 19b may perform a second page decoding operation on a first sub-codeword SubCW_1c by using the first tunneling parity P_Tunnel_1, the part P_SubCW_2c of the second sub-codeword, and the first sliding windows WD_1a to WD_na in the first direction which have variable sizes.

Referring to FIGS. 2 and 19A, in the second phase decoding operation, ECC decoder 19b may further read a second sub-codeword SubCW_2c from the buffer in memory controller 10 and perform partial decoding on the second sub-codeword SubCW_2c based on the second partial parity check matrix Partial_H2. Data HD generated by a partial decoding operation may be referred to as hard decision data.

Figure 19B:
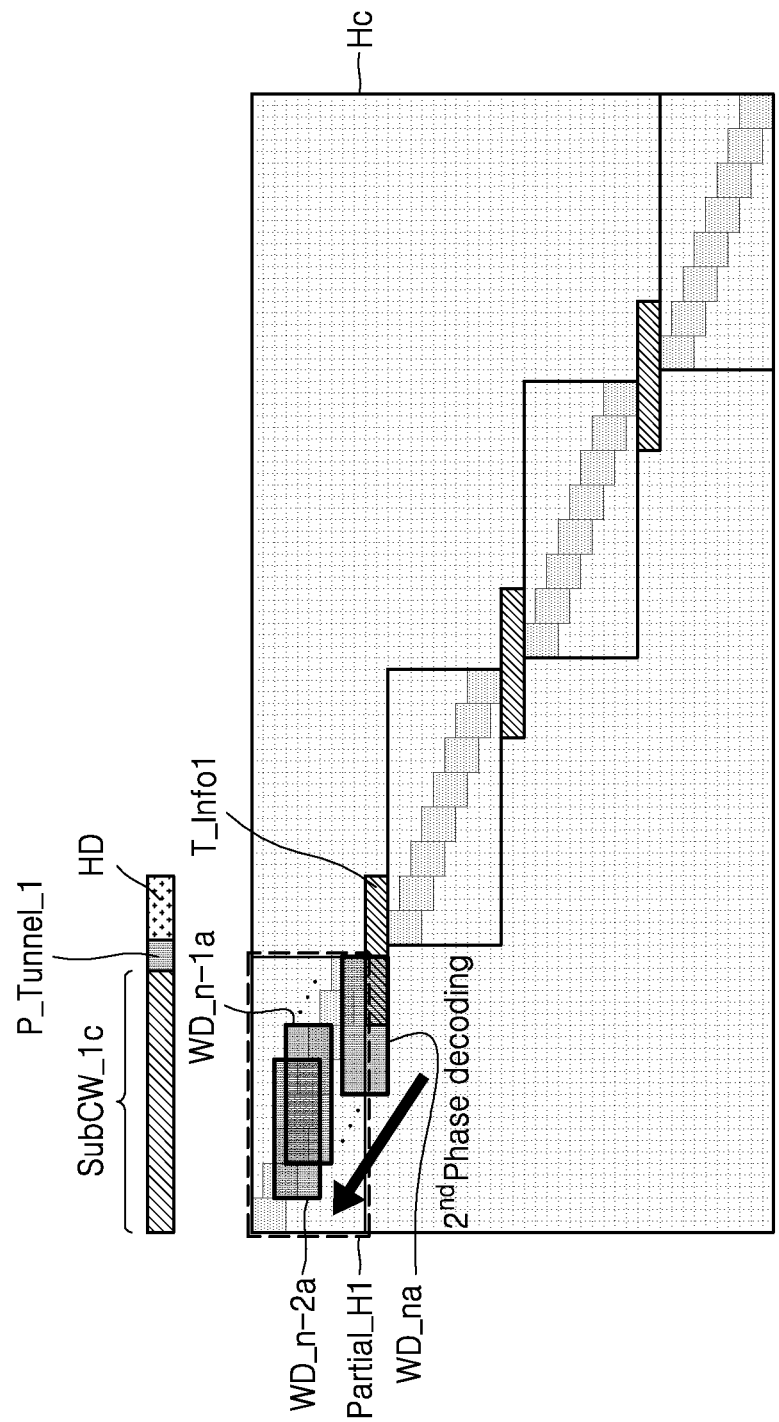

Referring to FIG. 19B, ECC decoder 19b may further read a first tunneling parity P_Tunnel_1 from the buffer in memory controller 10 and decode a first sub-codeword SubCW_1c' based on a first partial parity check matrix Partial_H1 and a part of first tunneling information T_Info_1. ECC decoder 19b may set first sliding windows WD_1a to WD_na, arranged in a second direction which may be opposite to the first direction and which have a fixed size, to include a part of the first tunneling information T_Info_1. For example, ECC decoder 19b may set the first sliding window WD_na to include a part of the first tunneling information T_Info_1. ECC decoder 19b may perform a second phase decoding operation on a first sub-codeword SubCW_1c by using the first sliding windows WD_1a to WD_na in the second direction, the first tunneling parity P_Tunnel_1 (or a part of the first tunneling parity P_Tunnel_1), and the hard decision data HD.

Figure 19C:
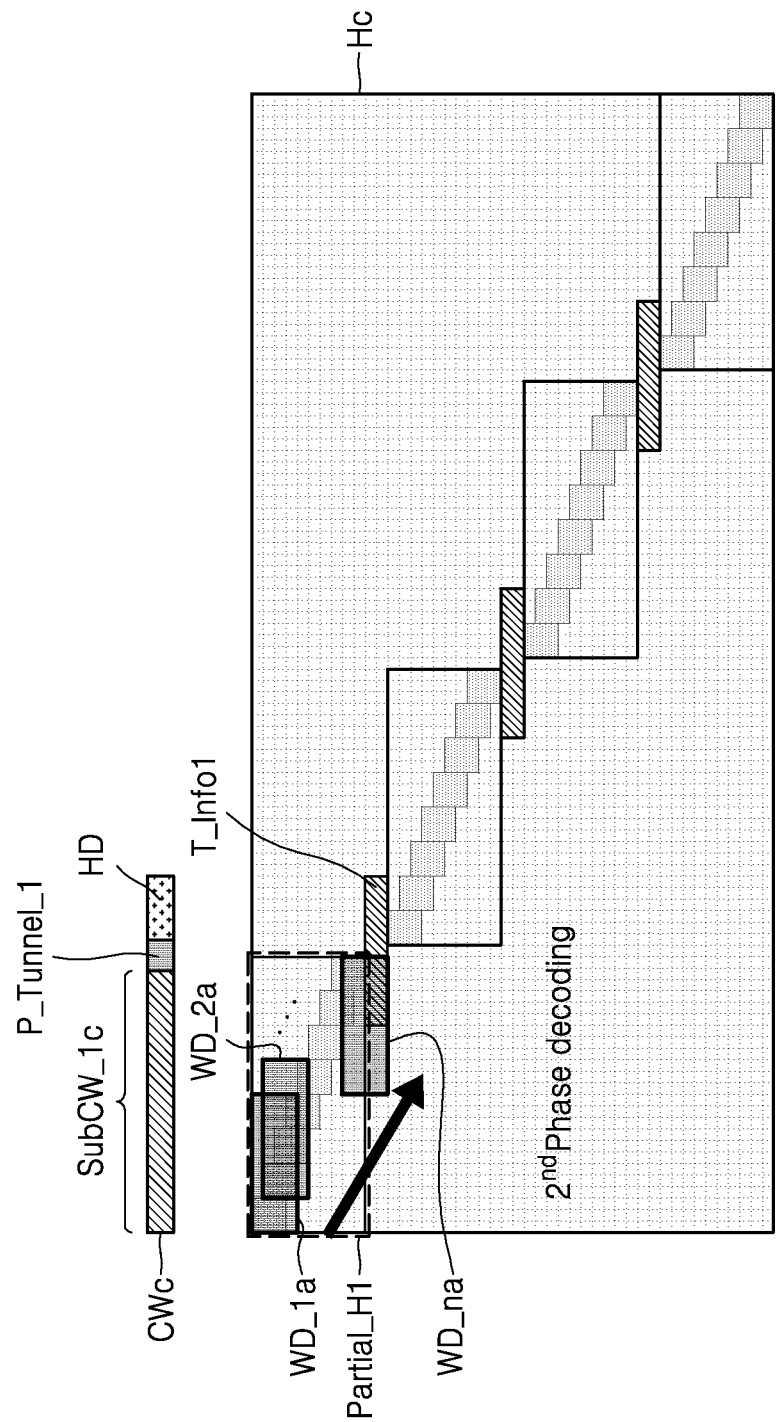

Referring to FIG. 19C, ECC decoder 19b may perform a second phase decoding operation on a first sub-codeword SubCW_1c by using first sliding windows WD_1a to WD_na in the first direction, unlike in FIG. 19B.

Figure 20A:
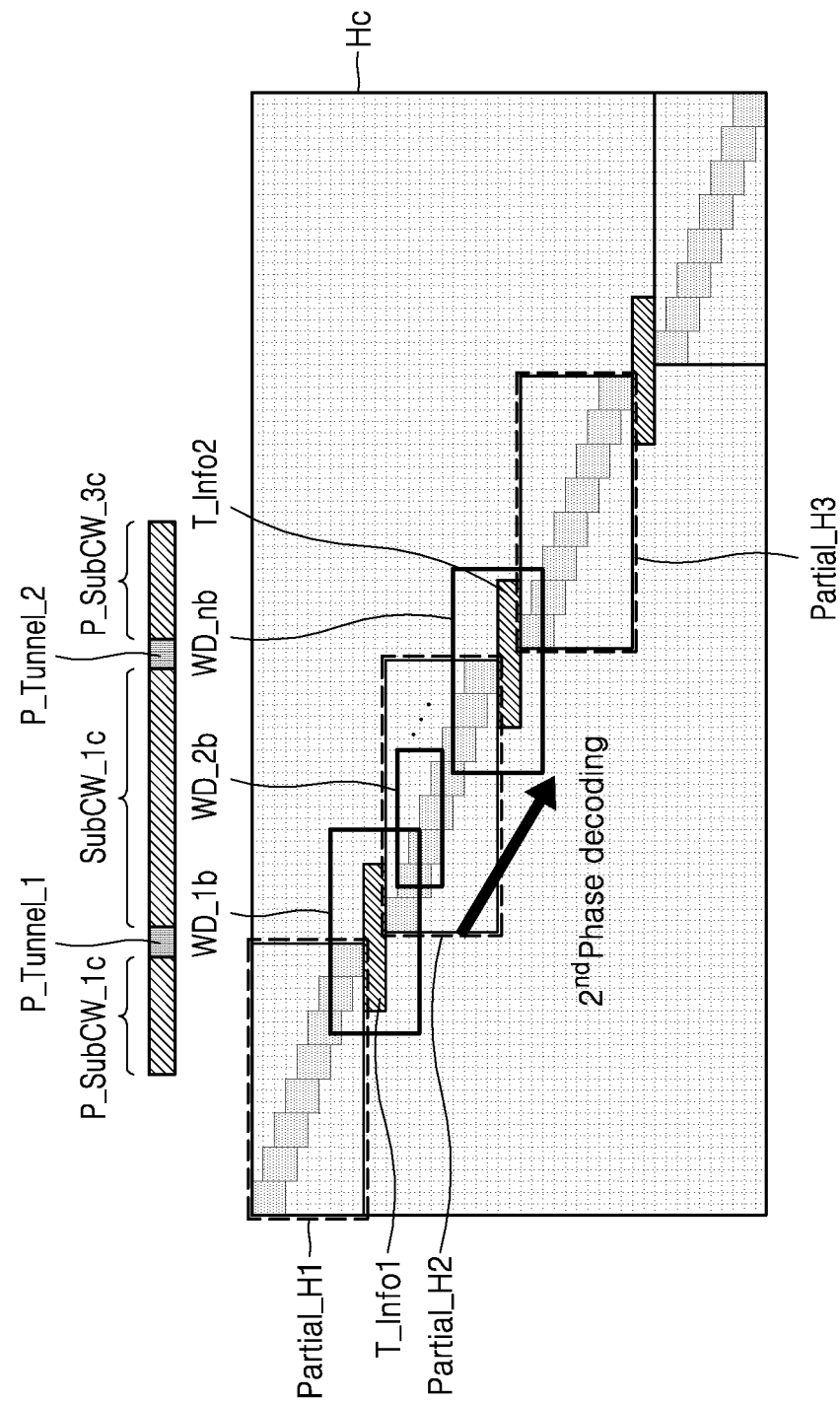

Referring to FIG. 20A, ECC decoder 19b may determine the degree of decoding failure. When the degree of decoding failure exceeds a threshold, ECC decoder 19b may further read an adjacent sub-codeword and a tunneling parity to perform a second phase decoding operation, unlike the second phase decoding operation described with reference to FIG. 18. ECC decoder 19b may determine the degree of decoding failure based on the number of check nodes that do not satisfy a parity check equation corresponding to the first partial parity check matrix Partial_H1.

In FIG. 20A, it is assumed that a first phase decoding operation of ECC decoder 19b performed on a second sub-codeword SubCW_2c has failed. ECC decoder 19b may further read a first tunneling parity P_Tunnel_1, a part P_SubCW_1c of a first sub-codeword, a second tunneling parity P_Tunnel_2, and a part P_SubCW_3c of a third sub-codeword from a buffer in memory controller 10 in the second phase decoding operation. In addition, ECC decoder 19b may set second sliding windows WD_1b to WD_nb in the first direction to include first tunneling information T_Info_1, a part of a first partial parity check matrix Partial_H1, second tunneling information T_Info_2, and a part of a third partial parity check matrix Partial_H3. For example, ECC decoder 19b may set the first sliding window WD_1b to include the first tunneling information T_Info_1 and a part of the first partial parity check matrix Partial_H1, and may set the last second sliding window WD_nb to include the second tunneling Information T_Info_2 and a part of the third partial parity check matrix Partial_H3. ECC decoder 19b may perform a second phase decoding operation on the second sub-codeword SubCW_2c by using the second sliding windows WD_1b to WD_nb in the first direction, the first tunneling parity P_Tunnel_1, the part P_SubCW_1c of the first sub-codeword, the second tunneling parity P_Tunnel_2, and the part P_SubCW_3c of the third sub-codeword.

Figure 20B:
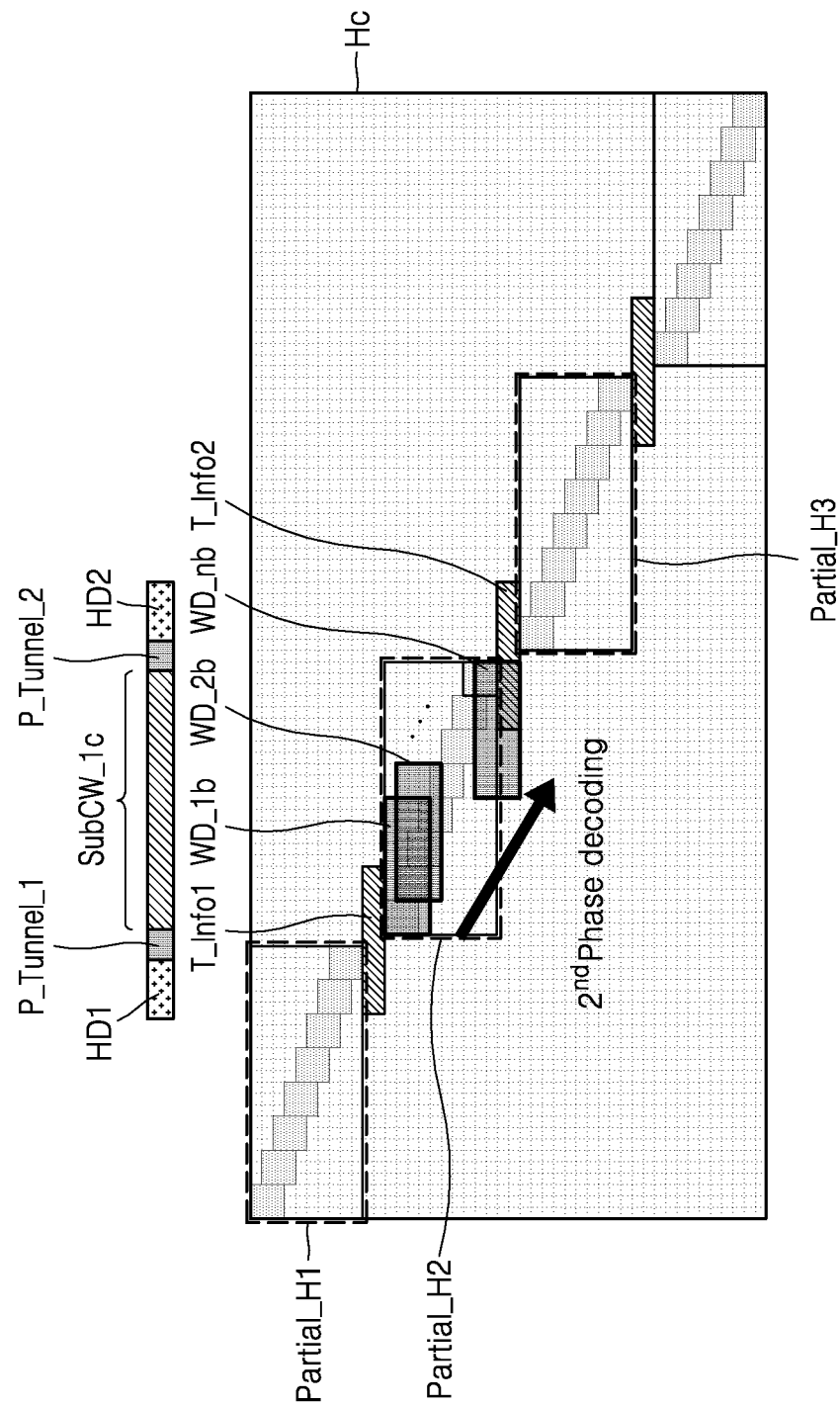
Figure 21:
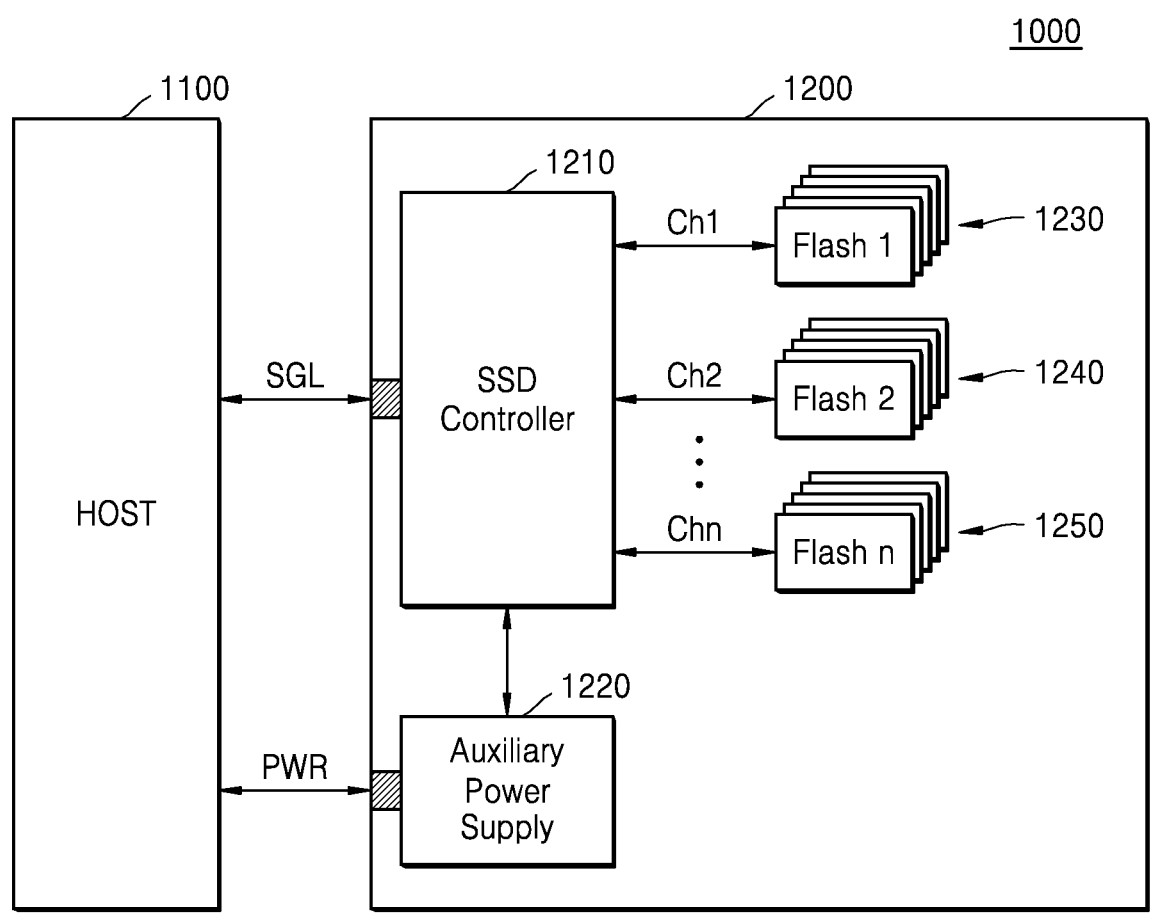

Referring to FIG. 20B, ECC decoder 19b may determine the degree of decoding failure. When the degree of decoding failure exceeds a threshold, ECC decoder 19b may perform a second phase decoding operation after further reading an adjacent sub-codeword and further generating hard decision data, unlike the second phase decoding operation described with reference to FIG. 19B.

In FIG. 20B, it is assumed that a first phase decoding operation of ECC decoder 19b performed on a second sub-codeword SubCW_2c has failed. ECC decoder 19b may further read a first sub-codeword SubCW_1c and a third sub-codeword SubCW_3c from a buffer in memory controller 10 in the second phase decoding operation, and may perform a partial decoding operation on the first sub-codeword SubCW_1c and a partial decoding operation on the third sub-codeword SubCW_3c to thereby generate first hard decision data HD1 and second hard decision data HD2, respectively. ECC decoder 19b may perform a second phase decoding operation on the second sub-codeword SubCW_2c by using first sliding windows WD_1a to WD_na in the first direction, first and second tunneling parities P_Tunnel_1 and P_Tunnel_2, and first and second hard decision data HD1 and HD2. Furthermore, when a phase operation including the first phase decoding operation and the second phase decoding operation fail, ECC decoder 19b may perform a joint decoding operation according to embodiments by using a sub-codeword adjacent to a target sub-codeword to be decoded.

In addition, the decoding scheme according to the embodiments is not limited thereto, and a decoding scheme using sliding windows set in different directions, described with reference to FIG. 6A or the like, may be applied to one partial parity check matrix. That is, when decoding a sub-codeword based on a partial parity check matrix, the sub-codeword may be divided into smaller data units and the partial parity check matrix may be divided into partial sub-parity check matrices, and thus a bi-directional decoding scheme described with reference to FIG. 6A and the like may be applied.

As is traditional in the field of the inventive concepts, examples may be described and illustrated in terms of blocks which carry out a described function or functions. These blocks, which may be referred to herein as units or modules or the like, may be physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block.

While the inventive concept has been particularly shown and described with reference to embodiments thereof, it will be understood that various changes in form and details may be made therein without departing from the spirit and scope of the following claims.

What is claimed is:

1. A method of operating a memory controller configured to perform decoding by using a parity check matrix corresponding to a convolution-type low density parity check (LDPC) code, the method comprising:
    receiving a codeword from at least one memory device, the codeword comprising a first sub-codeword and a second sub-codeword;
    decoding the first sub-codeword into first data by using first sliding windows in a first direction, set based on a first sub-matrix included in the parity check matrix and associated with the first sub-codeword; and
    decoding the second sub-codeword into second data by using second sliding windows in a second direction, set based on a second sub-matrix included in the parity check matrix and associated with the second sub-codeword,
    wherein the codeword further comprises a termination parity for ensuring that a syndrome of the codeword is a zero vector, and
    wherein the decoding of the first sub-codeword and the decoding of the second sub-codeword is performed based on a placement position of a termination matrix, associated with the termination parity, in the parity check matrix.

2. The method of claim 1, wherein the decoding of the first sub-codeword comprises decoding the first sub-codeword in a first direction from a least significant bit (LSB) to a most significant bit (MSB), and the decoding of the second sub-codeword comprises decoding the second sub-codeword in a second direction from an MSB to an LSB.

3. The method of claim 1, wherein, when the termination matrix is arranged at a last part in the second sub-matrix, and wherein the decoding of the second sub-codeword comprises decoding the second sub-codeword into the second data by using the termination parity and the second sliding windows in the second direction.

4. The method of claim 1, wherein the termination matrix is arranged at a boundary between the first sub-matrix and the second sub-matrix, wherein the decoding of the first sub-codeword comprises decoding the first sub-codeword into the first data by using the first sliding windows in the first direction and a part of the termination parity, and wherein the first sliding windows in the first direction are variable in size to include a part of the termination matrix arranged in the first sub-matrix and so as not to include a part of the second sub-matrix.

5. The method of claim 1, wherein the termination matrix is arranged at a boundary between the first sub-matrix and the second sub-matrix, wherein the decoding of the first sub-codeword comprises decoding the first sub-codeword into the first data by using the first sliding windows in the first direction, the termination parity, and a part of the second sub-codeword, and wherein the first sliding windows in the first direction have a constant size to include a part of the second sub-matrix.

6. The method of claim 1, wherein the receiving of the codeword comprises:
    receiving the first sub-codeword from a first memory device connected to the memory controller via a first channel; and
    receiving the second sub-codeword from a second memory device connected to the memory controller via a second channel.

7. The method of claim 6, wherein the memory controller comprises a first error checking and correcting (ECC) circuit and a second ECC circuit,
    wherein the decoding of the first sub-codeword is performed by the first ECC circuit, and the decoding of the second sub-codeword is performed by the second ECC circuit in parallel with the decoding of the first sub-codeword.

8. The method of claim 7, wherein the decoding of the first sub-codeword further comprises receiving decoding-related information about the second sub-codeword from the second ECC circuit,
    wherein the first sub-codeword is decoded into the first data by using the decoding-related information and the first sliding windows in the first direction.

9. The method of claim 1, further comprising:
    transmitting the first data to a host in response to a read request received from the host; and
    transmitting the second data to the host in response to another read request received from the host.

10. A method of operating a memory system, the method comprising:
    a memory controller of the memory system receiving from a host a write request and write data to be stored in the memory system;
    the memory controller performing a convolution-type low density parity check (LDPC) encoding of the write data using a parity check matrix to produce a codeword corresponding to the write data, wherein the parity check matrix includes a first sub-matrix, a second sub-matrix, and a termination matrix arranged at a boundary between the first sub-matrix and the second sub-matrix; and
    the memory controller writing the codeword into one or more memory devices of the memory system,
    wherein said LDPC encoding comprises:
        the memory controller encoding first data of the write data into a first sub-codeword based on a first sub-matrix included in the parity check matrix;
        the memory controller acquiring a first partial syndrome from a first result of encoding the first data;
        the memory controller encoding second data of the write data into a second sub-codeword based on a second sub-matrix included in the parity check matrix;
        the memory controller acquiring a second partial syndrome from a second result of encoding the second data; and
        the memory controller generating a termination parity associated with the termination matrix by using the first partial syndrome and the second partial syndrome,
    wherein the codeword comprises the first sub-codeword and the second sub-codeword and the termination parity.

11. The method of claim 10, wherein the memory controller is configured to encode the first data into the first sub-codeword by performing encoding in a first direction from a least significant bit (LSB) to a most significant bit (MSB) of the first data, and the memory controller is configured to encode the second data into the second sub-codeword in a second direction from an MSB to an LSB of the second data.

12. The method of claim 10, wherein the writing the codeword into the one or more memory devices comprises:
rearranging the first sub-codeword, the second sub-codeword, and the termination parity in the codeword so that the memory controller performs sequential decoding in a bit order of the codeword to be received from the one or more memory devices in response to a read request from the host; and
outputting the rearranged first sub-codeword, second sub-codeword, and termination parity to the one or more memory devices.

13. The method of claim 10, wherein writing the codeword into one or more memory devices of the memory system comprises:
writing the first sub-codeword to a first of the one or more memory devices via a first channel; and
writing the second sub-codeword to a second of the one or more memory devices via a second channel.

14. The method of claim 10, wherein:
a first error correction encoder of the memory controller encodes the first data of the write data into the first sub-codeword based on the first sub-matrix included in the parity check matrix, and
a second error correction encoder of the memory controller encodes the second data of the write data into the second sub-codeword based on the second sub-matrix included in the parity check matrix.

\* \* \* \* \*